United States Patent
Zhang et al.

(10) Patent No.: US 6,867,427 B2
(45) Date of Patent: Mar. 15, 2005

(54) MOLECULAR MECHANICAL DEVICES WITH A BAND GAP CHANGE ACTIVATED BY AN ELECTRIC FIELD FOR OPTICAL SWITCHING APPLICATIONS

(75) Inventors: Sean Xiao-An Zhang, Sunnyvale, CA (US); R. Stanley Williams, Redwood City, CA (US); Kent D. Vincent, Cupertino, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 29 days.

(21) Appl. No.: 10/618,358

(22) Filed: Jul. 10, 2003

(65) Prior Publication Data

US 2004/0101232 A1 May 27, 2004

Related U.S. Application Data

(60) Division of application No. 09/844,862, filed on Apr. 27, 2001, now Pat. No. 6,763,158, which is a continuation-in-part of application No. 09/823,195, filed on Mar. 29, 2001, which is a continuation-in-part of application No. 09/759,438, filed on Jan. 12, 2001, now Pat. No. 6,512,119, which is a continuation-in-part of application No. 09/738,793, filed on Dec. 14, 2000, now Pat. No. 6,663,797.

(51) Int. Cl.$^7$ .................. H01L 31/0352; G02F 1/00; C09K 19/02
(52) U.S. Cl. ............... 257/14; 385/16; 349/179
(58) Field of Search .................. 385/16; 257/14; 349/179

(56) References Cited

U.S. PATENT DOCUMENTS 5,159,421 A * 10/1992 Wolff .................. 257/22

| 5,655,038 A | 8/1997 | Schilling |
| 6,128,214 A | 10/2000 | Kuekes et al. |
| 6,198,655 B1 | 3/2001 | Heath et al. |
| 6,470,105 B1 | 10/2002 | Baney et al. |

OTHER PUBLICATIONS

Collier, C.P., et al., "Electrically Configurable Molecular–Based Logic Gates", Science, vol. 285, Jul. 16, 1999, pp 391–394.
Collier, C.P., et al., "A [2] Catenane–Based Solid State Electronically Reconfigurable Switch", Science, vol. 289, Aug. 18, 2000, pp 1172–1175.
Morales, A.M., et al., "A Laser Ablation Method for the Synthesis of Crystalline Semiconductor Nanowires", Since, vol. 279, Jan. 11, 1993, pp 208–211.
Heath, J.R., et al., " A Liquid Solution Synthesis of Single Crystal Gremanium Quantum Wires", Chemical Physics Letters, vol. 208, Jun. 11, 1993, pp 263–268.
Menon, V.P., et al., "Fabrication and Evaluation of Nano–Electrode Ensembles", Analytical Chemistry, vol. 67, Jul. 1, 1995, pp 1920–1928.
Vossmeyer, T., et al., "Combinatorial Approaches Toward Patterning Nanocrystals", Journal of Applied Physics, vol. 84, Oct. 1, 1998, pp 3664–3670.

(List continued on next page.)

Primary Examiner—Akm Enayet Ullah
Assistant Examiner—Jerry T Rahil

(57) ABSTRACT

Molecular systems are provided for electric field activated switches, such as optical switches. The molecular system has an electric field induced band gap change that occurs via one of the following mechanisms: (1) molecular conformation change; (2) change of extended conjugation via chemical bonding change to change the band gap; or (3) molecular folding or stretching. Nanometer-scale reversible optical switches are thus provided that can be assembled easily to make a variety of optical devices, including optical displays.

19 Claims, 3 Drawing Sheets

OTHER PUBLICATIONS

Leff, D.V., et al., "Thermodynamic Control of Gold Nanocrystal Size: Experiment and Theory", The Hournal of Physical Chemistry, vol. 99, May 4, 1995, pp 7036–7041.

Holloway, J.D., et al., "Electron–Trnasfer REactions of Metallocenes: Influence of Metal Oxidation STate on Structure and Reactivity", Journal of the American Chemical Society, vol. 101, Apr. 11, 1979, pp 2038–2044.

Collier, C.P., et al., "Electronically Configurable Molecular–Based Logic Gates", Science, vol. 285, Jul. 16, 1999, pp 391–394.

Greenberg, Charles B., "Optically Switchable Thin Films: A Review", Thin Solid Films, vol. 251, (1994), pp 81–93.

Mortimer, Roger J., "Electrochromic Materials", Chemical Society Reviews, vol. 26, 1997, pp 147–156.

* cited by examiner

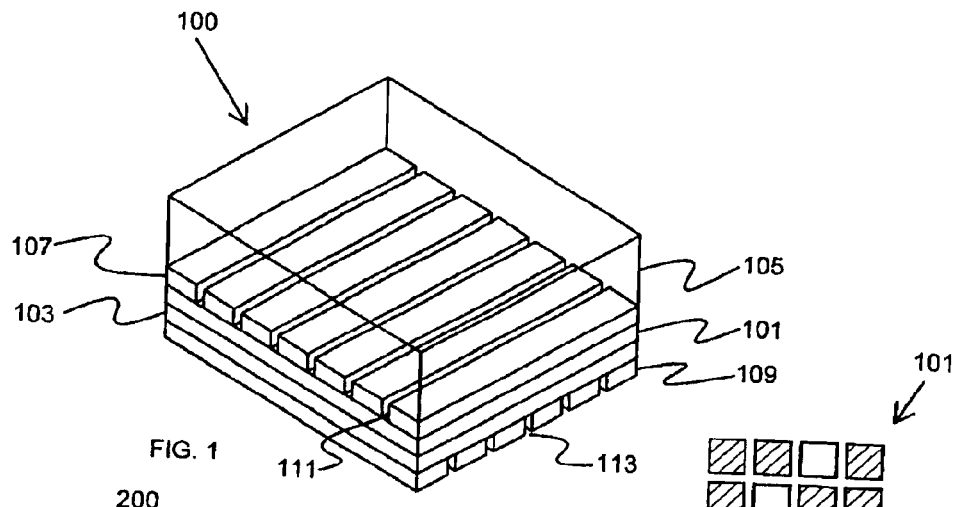
FIG. 1
FIG. 1a
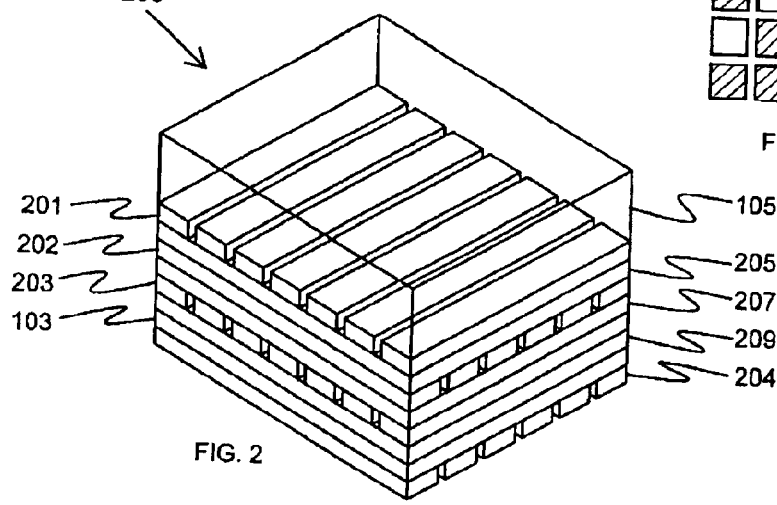
FIG. 2
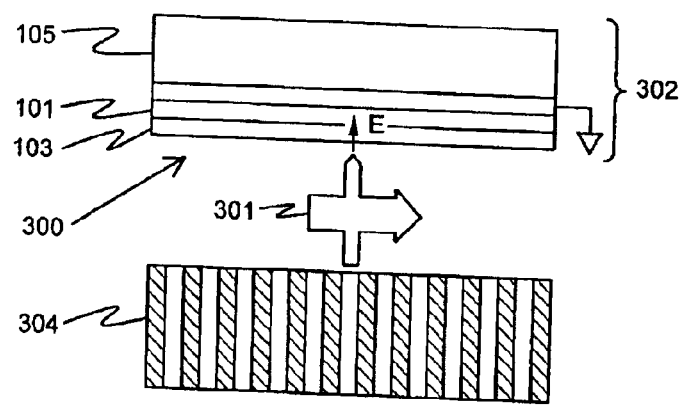
FIG. 3

MOLECULAR MECHANICAL DEVICES WITH A BAND GAP CHANGE ACTIVATED BY AN ELECTRIC FIELD FOR OPTICAL SWITCHING APPLICATIONS

CROSS-REFERENCE TO RELATED APPLICATIONS

This is divisional of application Ser. No. 09/844,862 filed on Apr. 27, 2001, now U.S. Pat. No. 6,763,158 which is hereby incorporated by reference herein.

The present application is a continuation-in-part application of Ser. No. 09/823,195, filed Mar. 29, 2001, which in turn is a continuation-in-part application of Ser. No. 09/759,438, filed Jan. 12, 2001, now U.S. Pat. No. 6,512,119, which in turn is a continuation-in-part application of Ser. No. 09/738,793, filed Dec. 14, 2000 now U.S. Pat. No. 6,663,797.

The present application is an improvement over the foregoing applications in that it is directed to classes of molecules that provide switching from one state to a different state, characterized by a change in the optical properties, including color, of the molecules. In the case of color switching, the present invention turns ink or dye or pigment molecules into active opto-electronic devices that can be switched by an external electric field.

TECHNICAL FIELD

The present invention relates generally to optical devices whose functional length scales are measured in nanometers, and, more particularly, to classes of molecules that provide optical switching. Optical devices both of micrometer and nanometer scale may be constructed in accordance with the teachings herein.

BACKGROUND ART

The area of molecular electronics is in its infancy. To date, there have been two convincing demonstrations of molecules as electronic switches published in the technical literature; see, C. P. Collier et al., Science, Vol. 285, pp. 391–394 (16 Jul. 1999) and C. P. Collier et al., Science, Vol. 289, pp. 1172–1175 (18 Aug. 2000), but there is a great deal of speculation and interest within the scientific community surrounding this topic. In the published work, a molecule called a rotaxane or a catenane was trapped between two metal electrodes and caused to switch from an ON state to an OFF state by the application of a positive bias across the molecule. The ON and OFF states differed in resistivity by about a factor of 100 and 5, respectively, for the rotaxane and catenane.

The primary problem with the rotaxane was that it is an irreversible switch. It can only be toggled once. Thus, it can be used in a programmable read-only memory (PROM), but not in a RAM-like (random access memory) device nor in a reconfigurable system, such as a defect-tolerant communications and logic network. In addition, the rotaxane requires an oxidation and/or reduction reaction to occur before the switch can be toggled. This requires the expenditure of a significant amount of energy to toggle the switch. In addition, the large and complex nature of rotaxanes and related compounds potentially makes the switching times of the molecules slow. The primary problems with the catenanes are small ON-to-OFF ratio and a slow switching time.

Currently, there are a wide variety of known chromogenic materials that can provide optical switching in thin film form. These materials and their applications have been reviewed recently by C. B. Greenberg, Thin Solid Films, Vol. 251, pp. 81–93 (1994) and R. J. Mortimer, Chemical Society Reviews, Vol. 26, pp. 147–156 (1997). These materials are currently being studied for several applications, including active darkening of sunglasses, active darkening of windows for intelligent light and thermal management of buildings, and various types of optical displays, such as heads-up displays on the inside of windshields of automobiles or airplanes and eyeglass displays.

Despite their long history of great promise, there are very few photon gating devices made from the existing classes of electrochromic materials. This is because most of them require an oxidation-reduction reaction that involves the transport of ions, such as $H^+$, $Li^+$, or $Na^+$ through some type of liquid or solid electrolyte. Finding the appropriate electrolyte is a major problem, as is the slow speed of any device that requires transport of ions. Furthermore, such reactions are extremely sensitive to background contamination, such as oxygen or other species, and thus degradation of the chromogenic electrodes is a major limitation.

In fact, for photonic switching applications such as a crossbar switch router for a fiber optic communications network, the lack of a suitable chromogenic material has forced companies to use very different approaches: (a) transform the optical signal into an electronic signal, perform the switching operation, and then transform back to an optical signal before launching into a fiber (this is the most frequent solution used today, but it is very inefficient and difficult for the electronics to keep up with the data rates of the optical system); (b) use a moving-mirror array made by micro-electromechanical (MEM) processing to switch optical data packets (this has the disadvantage that extremely high tolerances are required for the device, which makes it very expensive); and (c) using ink jet technology to push bubbles into a chamber to create a mirror to deflect an optical beam (this approach again requires precision manufacturing and the switching time is slow).

Thus, what is needed is a molecular system that avoids chemical oxidation and/or reduction, permits reasonably rapid switching from a first state to a second, is reversible to permit real-time or video rate display applications, and can be used in a variety of optical devices.

DISCLOSURE OF INVENTION

In accordance with the present invention, a molecular system is provided for optical switching. The molecular system has an electric field induced band gap change that occurs via one of the following mechanisms:

(1) molecular conformation change or an isomerization;

(2) change of extended conjugation via chemical bonding change to change the band gap; or (3) molecular folding or stretching.

Changing of extended conjugation via chemical bonding change to change the band gap may be accomplished in one of the following ways:

(a) charge separation or recombination accompanied by increasing or decreasing band localization; or (b) change of extended conjugation via charge separation or recombination and π-bond breaking or formation.

The present invention provides, e.g., optical switches that can be assembled easily to make displays, electronic books, rewrittable media, electronic lenses, electrically-controlled tinting for windows and mirrors, optical crossbar switches for fiber optic communications, and more. Such applications are discussed elsewhere, and are not germane to the present invention, except to the extent that the optical switch of the present invention is employed in the construction of apparatus of such applications.

The present invention introduces several new types of switching mechanism: (1) an electric (E) field induced rotation of at least one rotatable section (rotor) of a molecule to change the band gap of the molecule; (2) E-field induced charge separation or re-combination of the molecule via chemical bonding change to change the band gap; (3) E-field induced band gap change via molecule folding or stretching. These devices are generically considered to be electric field devices, and are to be distinguished from earlier embodiments (described in the above-mentioned related patent applications and patent) that are directed to electrochemical devices.

The present invention also introduces the capability of using molecules for optical switches, in which the molecules change color when changing state. This property can be used for a wide variety of display devices or any other application enabled by a material that can change color or transform from transparent to colored.

Thus, the molecule is not oxidized nor reduced in the toggling of the switch. Also, the part of the molecule that moves is quite small, so the switching time should be very fast. Also, the molecules are much simpler and thus easier and cheaper to make than the rotaxanes, catenanes, and related compounds.

BRIEF DESCRIPTION OF THE DRAWINGS

FIG. 1 is a schematic representation (perspective, transparent view) of a two color (e.g., black and white) display screen construction for use in accordance with the present invention;

FIG. 1a is a detail for a colorant layer element of the display screen depicted in FIG. 1;

FIG. 2 is a schematic representation (perspective, transparent view) of a full-color display screen construction for use in accordance with the present invention;

FIG. 3 is a schematic representation of a scan addressing embodiment of a two-color display screen construction for use in accordance with the present invention;

BEST MODES FOR CARRYING OUT THE INVENTION

A. Definitions

Figure 4:
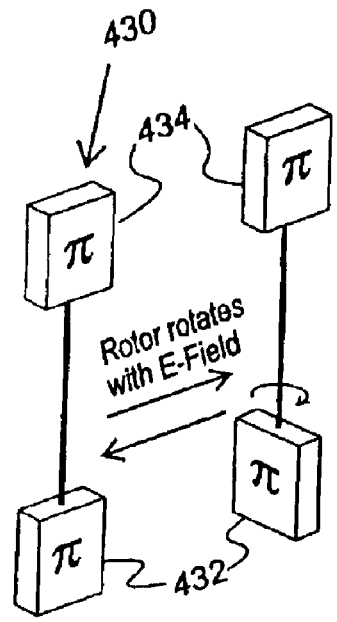
FIG. 4 is a schematic model depicting an E-field-induced band gap change via molecular conformation change (rotor/stator type of model)

The term "self-assembled" as used herein refers to a system that naturally adopts some geometric pattern because of the identity of the components of the system; the system achieves at least a local minimum in its energy by adopting this configuration.

The term "singly configurable" means that a switch can change its state only once via an irreversible process such as an oxidation or reduction reaction; such a switch can be the basis of a programmable read-only memory (PROM), for example.

The term "reconfigurable" means that a switch can change its state multiple times via a reversible process such as an oxidation or reduction; in other words, the switch can be opened and closed multiple times, such as the memory bits in a random access memory (RAM) or a color pixel in a display.

The term "bi-stable" as applied to a molecule means a molecule having two relatively low energy states (local minima) separated by an energy (or activation) barrier. The molecule may be either irreversibly switched from one state to the other (singly configurable) or reversibly switched from one state to the other (reconfigurable). The term "multi-stable" refers to a molecule with more than two such low energy states, or local minima.

Micron-scale dimensions refers to dimensions that range from 1 micrometer to a few micrometers in size.

Sub-micron scale dimensions refers to dimensions that range from 1 micrometer down to 0.05 micrometers.

Nanometer scale dimensions refers to dimensions that range from 0.1 nanometers to 50 nanometers (0.05 micrometers).

Micron-scale and submicron-scale wires refers to rod or ribbon-shaped conductors or semiconductors with widths or diameters having the dimensions of 0.05 to 10 micrometers, heights that can range from a few tens of nanometers to a micrometer, and lengths of several micrometers and longer.

"HOMO" is the common chemical acronym for "highest occupied molecular orbital", while "LUMO" is the common chemical acronym for "lowest unoccupied molecular orbital". HOMOs and LUMOs are responsible for electronic conduction in molecules and the energy difference between the HOMO and LUMO and other energetically nearby molecular orbitals is responsible for the color of the molecule.

An optical switch, in the context of the present invention, involves changes in the electromagnetic properties of the molecules, both within and outside that detectable by the human eye, e.g., ranging from the far infra-red (IR) to deep ultraviolet (UV). Optical switching includes changes in properties such as absorption, reflection, refraction, diffraction, and diffuse scattering of electromagnetic radiation.

The term "transparency" is defined within the visible spectrum to mean that optically, light passing through the colorant is not impeded or altered except in the region in which the colorant spectrally absorbs. For example, if the molecular colorant does not absorb in the visible spectrum, then the colorant will appear to have water clear transparency.

The term "omni-ambient illumination viewability" is defined herein as the viewability under any ambient illumination condition to which the eye is responsive.

B. Optical Switches

Optical switches are described in greater detail in co-pending U.S. application Ser. No. 09/98166, filed on Oct.

16, 2001. A generic example taken from that application is depicted herein in FIG. 1, wherein a display screen 100 is shown that incorporates at least one colorant layer 101. The colorant layer 101 comprises a pixel array using electrical field switchable, reconfigurable, dye or pigment molecules of the present invention, described in greater detail below and generically referred to as a "molecular colorant". Each dye or pigment molecule is field switchable either between an image color (e.g., black) and transparent or between two different colors (e.g., red and green).

Referring briefly to FIG. 1a, the colorant layer 101 is an addressable pixel array formed of bi-stable molecules arrayed such that a selected set of molecules correlates to one pixel. The colorant layer 101 is a thin layer coated on a background substrate 103 having the display's intended background color (e.g., white). The substrate 103 may comprise, for example, a high dielectric pigment (e.g., titania) in a polymer binder that provides good white color and opacity while also minimizing the voltage drop across the layer. The stratified combination of colorant layer 101 and substrate 103 thus is fully analogous to a layer of ink on paper. In a blank mode, or erased state, each molecule is switched to its transparent orientation; the "layer of ink" is invisible. The background (e.g., white pixels) shows through in those pixel areas where the colorant layer 101 molecules are switched to the transparent orientation. A transparent view-through layer 105, such as of a clear plastic or glass, is provided superjacent to the colorant-background sandwich to provide appropriate protection. The view-through layer 105 has a transparent electrode array 107 for pixel column or row activation mounted thereto and positioned superjacently to the colorant layer 101. The background substrate 103 has a complementary electrode array 109 for pixel row or column activation mounted thereto (it will be recognized by those skilled in the art that a specific implementation of the stratification of the electrode arrays 107, 109 for matrix addressing and field writing of the individual pixels may vary in accordance with conventional electrical engineering practices). Optionally, the pixels are sandwiched by employing thin film transistor (TFT) driver technology as would be known in the art.

The present display 100 is capable of the same contrast and color as hard copy print. A molecular colorant is ideal because its size and mass are infinitesimally small, allowing resolution and colorant switching times that are limited only by the field writing electrodes and circuitry. Like ink, the colorant layer 101 may develop adequate density in a sub-micron to micron thin layer, potentially lowering the field voltage required to switch the colorant between logic states and thus allowing the use of inexpensive drive circuitry.

Suitable reconfigurable bi-stable molecules for use in such displays are disclosed below and claimed herein. In the main, these molecules have optical properties (e.g., color) that are determined by the extent of their π orbital electron conjugation. The optical properties, including color or transparency, of the molecule change with field polarity applied across the molecule and remains chromatically stable in the absence of an applied electric field. By disrupting the continuity of conjugation across a molecule, the molecule may be changed from one optical state to another, e.g., colored to transparent. Electric dipoles may be designed into the colorant that can physically cause this disruption by rotating or otherwise distorting certain segments of the dye or pigment molecule relative to other segments, when an external electric field is applied or changed.

The colorant layer 101 is a homogeneous layer of molecules which are preferably colored (e.g., black, cyan, magenta, or yellow) in a more-conjugated orientation and transparent in a less-conjugated orientation. By making the abutting background substrate 103 white, the colorant layer 101 may thereby produce high contrast black and white, and colored images. The colorant layer 101 may comprise a single field switchable dye or pigment or may comprise a mixture of different switchable dyes or pigments that collectively produce a composite color (e.g., black). By using a molecular colorant, the resolution of the produced image is limited only by the electric field resolution produced by the electrode array 107, 109. The molecular colorant additionally has virtually instantaneous switching speed, beneficial to the needs of fast scanning (as described with respect to FIG. 3 hereinafter). In certain cases, the molecular colorant may be contained in a polymeric layer. Polymers for producing such coatings are well-known, and include, for example, acrylates, urethanes, and the like. Alternatively, the colorant layer 101 may be self-assembled.

In one embodiment, the colorant layer 101 is offered as a substitute for matrix-addressed liquid crystal flat panel displays. As is well-known for such displays, each pixel is addressed through rows and columns of fixed-position electrode arrays, e.g., 107, 109. The fixed-position electrode arrays 107, 109 consist of conventional crossbar electrodes 111, 113 that sandwich the colorant layer 101 to form an overlapping grid (matrix) of pixels, each pixel being addressed at the point of electrode overlap. The crossbar electrodes 111, 113 comprise parallel, spaced electrode lines arranged in electrode rows and columns, where the row and column electrodes are separated on opposing sides of the colorant layer 101. Preferably, a first set of transparent crossbar electrodes 107 (201, 203 in FIG. 2 described in detail hereinafter) is formed by thin film deposition of indium tin oxide (ITO) on a transparent substrate (e.g., glass). These row addressable pixel crossbar electrodes 107 are formed in the ITO layer using conventional thin film patterning and etching techniques. The colorant layer 101 and background substrate 103 are sequentially coated over or mounted to the transparent electrode layer, using conventional thin film techniques (e.g., vapor deposition) or thick film techniques (e.g., silkscreen, spin cast, or the like). Additional coating techniques include Langmuir-Blodgett deposition and self-assembled monolayers. Column addressable pixel crossbar electrodes 109 (202, 204 in FIG. 2) are preferably constructed in like manner to the row electrodes 107. The column addressable pixel crossbar electrodes 109 may optionally be constructed on a separate substrate that is subsequently adhered to the white coating using conventional techniques.

This display 100, 200 provides print-on-paper-like contrast, color, viewing angle, and omni-ambient illumination viewability by elimination of the polarization layers required for known liquid crystal colorants. Using the described-display also allows a significant reduction in power drain. Whereas liquid crystals require a holding field even for a static image, the present molecules of the colorant layer 101 can be modal in the absence of a field when bi-stable molecules are used. Thus, the present bi-stable colorant layer 101 only requires a field when a pixel is changed and only for that pixel. The power and image quality improvements will provide significant benefit in battery life and display readability, under a wider range of viewing and illumination conditions for appliances (e.g., wristwatches, calculators, cell phones, or other mobile electronic applications) television monitors and computer displays. Furthermore, the colorant layer may comprise a mosaic of colored pixels using an array of bi-stable color molecules of various colors for lower resolution color displays.

Since each colorant molecule in colorant layer 101 is transparent outside of the colorant absorption band, then multiple colorant layers may be superimposed and separately addressed to produce higher resolution color displays than currently available. FIG. 2 is a schematic illustration of this second embodiment. A high resolution, full color, matrix addressable, display screen 200 comprises alternating layers of transparent electrodes—row electrodes 201, 203 and column electrodes 202 and 204—and a plurality of colorant layers 205, 207, 209, each having a different color molecule array. Since each pixel in each colorant layer may be colored or transparent, the color of a given pixel may be made from any one or a combination of the color layers (e.g., cyan, magenta, yellow, black) at the full address resolution of the display. When all colorant layers 205, 207, 209 for a pixel are made transparent, then the pixel shows the background substrate 103 (e.g., white). Such a display offers the benefit of three or more times resolution over present matrix LCD devices having the same pixel density but that rely on single layer mosaic color. Details of the fabrication of the display are set forth in the above-mentioned co-pending application.

The color to be set for each pixel is addressed by applying a voltage across the electrodes directly adjacent to the selected color layer. For example, assuming yellow is the uppermost colorant layer 205, magenta is the next colorant layer 207, and cyan is the third colorant layer 209, then pixels in the yellow layer are addressed through row electrodes 201 and column electrodes 202, magenta through column electrodes 202 and row electrodes 203, and cyan through row electrodes 203 and column electrodes 204. This simple common electrode addressing scheme is made possible because each colorant molecule is color stable in the absence of an applied electric field.

FIG. 3 depicts a third embodiment, which employs scan-addressing rather than matrix-addressing. Matrix address displays are presently limited in resolution by the number of address lines and spaces that may be patterned over the relatively large two-dimensional surface of a display, each line connecting pixel row or column to the outer edge of the display area. In this third embodiment, the bi-stable molecular colorant layer 101 and background substrate 103 layer construction is combined with a scanning electrode array printhead to provide a scanning electrode display apparatus 300 having the same readability benefits as the first two embodiments described above, with the addition of commercial publishing resolution. Scanning electrode arrays and drive electronics are common to electrostatic printers and their constructions and interfaces are well-known. Basically, remembering that the bi-stable molecular switch does not require a holding field, the scanning electrode array display apparatus 300 changes a displayed image by printing a pixel row at a time. The scanning electrode array display apparatus 300 thus provides far greater resolution by virtue of the ability to alternate odd and even electrode address lines along opposing sides of the array, to include multiple address layers with pass-through array connections and to stagger multiple arrays that proportionately superimpose during a scan. The colorant layer 101 may again be patterned with a color mosaic to produce an exceptionally high resolution scanning color display.

More specifically, the third embodiment as shown in FIG. 3 comprises a display screen 302, a scanned electrode array 304, and array translation mechanism 301 to accurately move the electrode array across the surface of the screen. The display screen 302 again comprises a background substrate 103, a transparent view-through layer 105, and at least one bi-stable molecule colorant layer 101. The colorant layer 101 may include a homogeneous monochrome colorant (e.g., black) or color mosaic, as described herein above. The scanned electrode array 304 comprises a linear array or equivalent staggered array of electrodes in contact or near contact with the background substrate 103. A staggered array of electrodes may be used, for example, to minimize field crosstalk between otherwise adjacent electrodes and to increase display resolution.

In operation, each electrode is sized, positioned, and electrically addressed to provide an appropriate electric field, represented by the arrow labeled "E", across the colorant layer 101 at a given pixel location along a pixel column. The field E may be oriented perpendicular to the plane of the colorant layer 101 or parallel to it, depending on the color switching axis of the colorant molecules. A perpendicular field may be produced by placing a common electrode (e.g., an ITO layer) on the opposing coating side to the electrode array. The electrode array may also be constructed to emit fringe fields; a parallel fringe field may be produced by placing a common electrode adjacent and parallel to the array. A perpendicular fringe field may be produced by placing symmetrically spaced parallel common electrodes about the electrode array(s). The voltage is adjusted so that the dominant field line formed directly beneath the array 304 is sufficiently strong to switch the addressed colorant molecule(s) and divided return lines are not. Additional information regarding alternate embodiments and scanning mechanisms are discussed in the above-mentioned co-pending application.

C. Present Invention

In accordance with the present invention, molecules evidencing one of several new types of switching are provided for the colorant layer 101. That is to say, the present invention introduces several new types of switching mechanisms that distinguish it from the prior art:

(1) an electric field ("E-field") induced rotation of at least one rotatable section (rotor) or a molecule to change the band gap of the molecule;

(2) E-field induced charge separation or recombination of the molecule via chemical bonding change to change the band gap; and (3) E-field induced band gap change via molecular folding or stretching.

Thus, the color switching is the result of an E-field inducer intramolecular change rather than a diffusion or oxidation/reduction reaction, in contrast to prior art approaches. Also, the part of the molecule that moves is quite small, so the switching time is expected to be quite fast. Also, the molecules are much simpler and thus easier and cheaper to make than the rotaxanes, catenanes, and related compound.

Figure 6A:
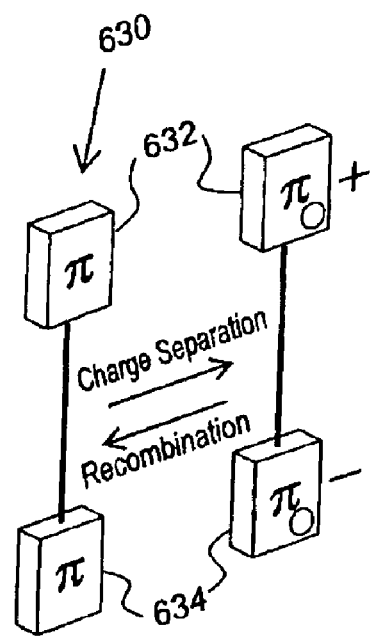
FIG. 6a is a schematic model depicting an E-field-induced band gap change caused by the change of extended conjugation via charge separation or recombination accompanied by increasing or decreasing band localization.
Figure 6B:
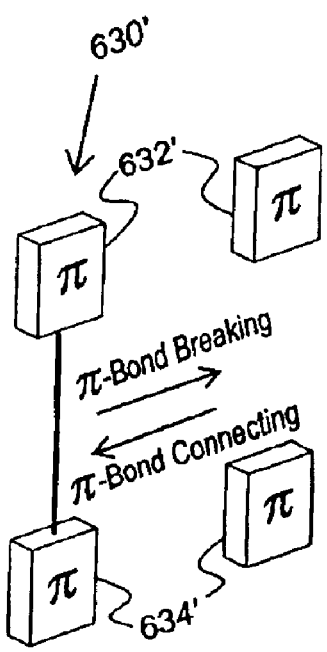
FIG. 6b is a schematic model depicting an E-field-induced band gap change caused by change of extended conjugation via charge separation or recombination and π-bond breaking or formation.
Figure 7:
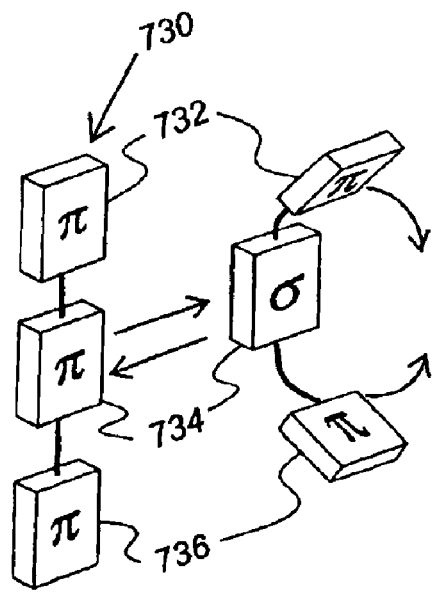
FIG. 7 is a schematic model depicting an E-field-induced band gap change via molecular folding or stretching.

The following are examples of model molecules with a brief description of their function:

(1) E-field induced band gap change via molecular conformation change (rotor/stator type of model)—FIGS. 4 and 5a–5c;

(2a) E-field-induced band gap change caused by the change of extended conjugation via charge separation or recombination accompanied by increasing or decreasing band localization—FIG. 6a;

(2b) E-field-induced band gap change caused by change of extended conjugation via charge separation or recombination and π-bond breaking or formation—FIG. 6b; and (3) E-field-induced band gap change via molecule folding or stretching—FIG. 7.

Each model, with supporting examples, is discussed below. However, the examples given are not to be considered limiting the invention to the specific molecular systems illustrated, but rather merely exemplary of the above switching mechanisms.

Figure 5A:
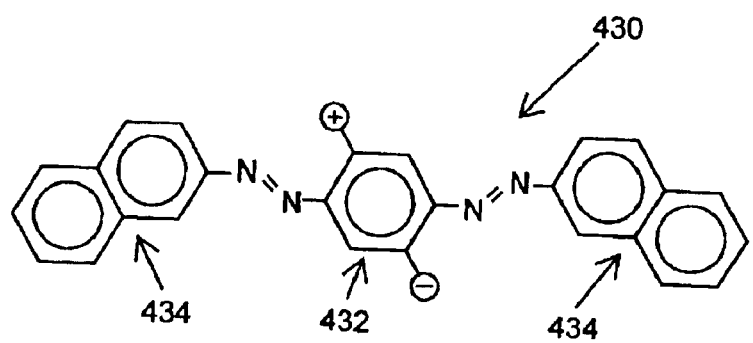
FIG. 5a depicts a molecule comprising a middle rotor portion with a dipole and two end stator portions.
Figure 5B:
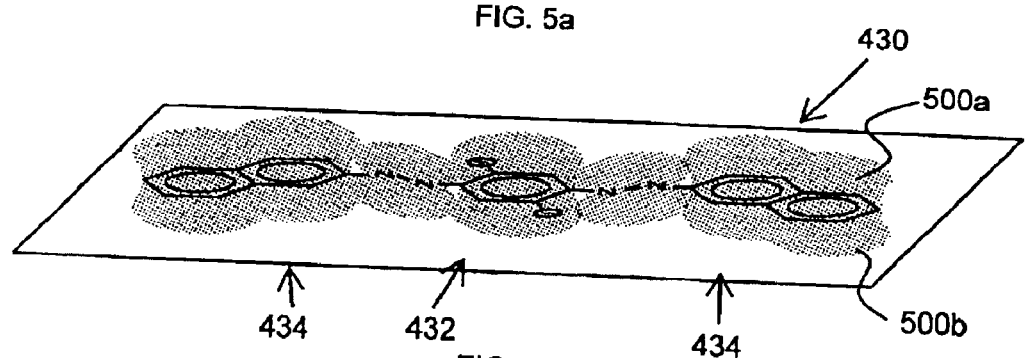
FIG. 5b is a schematic representation (perspective) of the molecule depicted in FIG. 5a, illustrating the planar state, with the rotor and stators all co-planar.
Figure 5C:
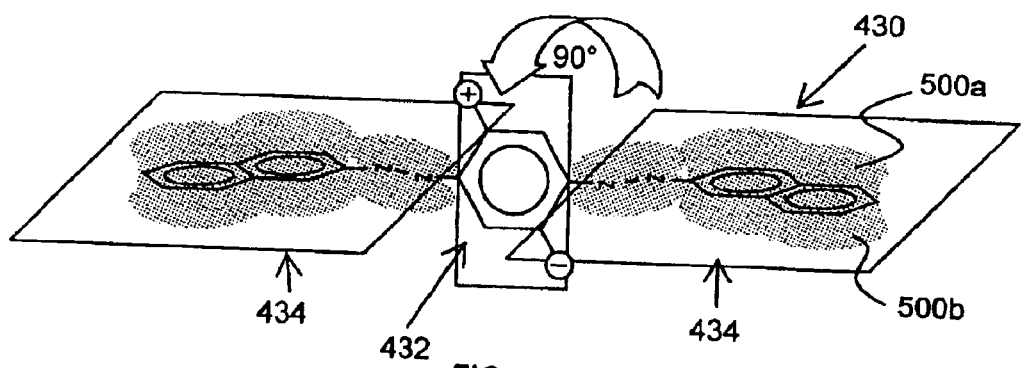
FIG. 5c is also a schematic representation (perspective), illustrating the rotated state, with the rotor rotated 90° with respect to the stators.

Model (1): E-Field-Induced Band Gap Change Via Molecular Conformation Change (Rotor/Stator Type of Model):

FIG. 4 is a schematic depiction of one embodiment of this model, which involves an E-field-induced band gap change via molecular conformation change (rotor/stator type of model). As shown in FIG. 4, the molecule 430 comprises a rotor portion 432 and a stator portion 434. The rotor portion 432 rotates with an applied electric field. In one state, depicted on the left side of the drawing, there is an extended conjugation through the entire molecule, resulting in a relatively smaller band gap and thereby longer wavelength (red-shifted) photo-absorption. In the other state, following rotation of the rotor, depicted on the right side of the drawing, the extended conjugation is changed, resulting in a relatively larger band gap and thereby shorter wavelength (blue-shifted) photo-absorption. FIGS. 5a–5c depict an alternate, and preferred, embodiment of this Model 1; these latter Figures are discussed in connection with Examples 1 and 2 of this Model 1 below.

The following requirements must be met in this model:

(a) The molecule must have at least one rotor segment and at least one stator segment;

(b) In one state of the molecule, there should be delocalized HOMOs and/or LUMOs (π-states and/or non-bonding orbitals) that extend over a large portion of the molecule (rotor(s) and stator(s)), whereas in the other state, the orbitals are localized on the rotor(s) and stator(s), and other segments;

(c) The connecting unit between rotor and stator can be a single σ-bond or at least one atom with (1) non-bonding electrons (p or other electrons), or (2) π-electrons, or (3) π-electrons and non-bonding electron(s);

(d) The non-bonding electrons, or π-electrons, or π-electrons and non-bonding electron(s) of the rotor(s) and stator(s) can be localized or delocalized depending on the conformation of the molecule, while the rotor rotates when activated by an E-field;

(e) The conformation(s) of the molecule can be E-field dependent or bi-stable;

(f) The bi-stable state(s) can be achieved by intra- or inter-molecular forces such as hydrogen bonding, Coulomb force, van der Waals force, metal ion complex or dipole inter-stabilization; and (g) The band gap of the molecule will change depending on the degree of non-bonding electron, or π-electron, or π-electron and non-bonding electron delocalization of the molecule. This will control the optical properties (e.g., color and/or index of refraction, etc.) of the molecule.

Following are two examples of this model (Examples 1 and 2):

The novel bi-modal molecules of the present invention are active optical devices that can be switched with an external electric field. Preferably, the colorant molecules are bi-stable. The general idea is to design into the molecules a rotatable middle segment (rotor) 432 that has a large dipole moment (see Examples 1 and 2) and that links two other portions of the molecule 430 that are immobilized (stators) 434. Under the influence of an applied electric field, the vector dipole moment of the rotor 432 will attempt to align parallel to the direction of the external field. However, the molecule 430 is designed such that there are inter- and/or intra-molecular forces, such as hydrogen bonding or dipole-dipole interactions as well as steric repulsions, that stabilize the rotor 432 in particular orientations with respect to the stators 434. Thus, a large electric field is required to cause the rotor 432 to unlatch from its initial orientation and rotate with respect to the stators 434.

Once switched into a particular orientation, the molecule 430 will remain in that orientation until it is switched to a different orientation, or reconfigured. However, a key component of the molecule design is that there is a steric repulsion or hindrance that will prevent the rotor 432 from rotating through a complete 180 degree half cycle. Instead, the rotation is halted by the steric interaction of bulky groups on the rotor 432 and stators 434 at an optically significant angle of typically between 10° and 170° from the initial orientation. For the purposes of illustration, this angle is shown as 90° in the present application. Furthermore, this switching orientation may be stabilized by a different set of inter- and/or intra-molecular hydrogen bonds or di-pole interactions, and is thus latched in place even after the applied field is turned off. For bi- or multi-stable colorant molecules, this ability to latch the rotor 432 between two states separated by an optically significant rotation from the stators is crucial.

The foregoing strategy may be generalized to design colorant molecules to provide several switching steps so as to allow multiple states (more than two) to produce a multi-state (e.g., multi-color) system. Such molecules permit the optical proper ties of the colorant layer to be tuned continuously with a decreasing or increasing electric field, or changed abruptly from one state to another by applying a pulsed field.

Further, the colorant molecules may be designed to include the case of no, or low, activation barrier for fast but volatile switching. In this latter situation, bi-stability is not required, and the molecule is switched into one state by the electric field and relaxes back into its original state upon removal of the field ("bi-modal"). In effect, these forms of the bi-modal colorant molecules are "self-erasing". In contrast, with bi-stable colorant molecules, the colorant molecule remains latched in its state upon removal of the field (non-volatile switch), and the presence of the activation barrier in that case requires application of an opposite field to switch the molecule back to its previous state.

When the rotor 432 and stators 434 are all co-planar, the molecule is referred to as "more-conjugated". Thus, the non-bonding electrons, or π-electrons, or π-electrons and non-bonding electrons of the colorant molecule, through its highest occupied molecular orbital (HOMO) and lowest unoccupied molecular orbital (LUMO), are delocalized over a large portion of the molecule 430. This is referred to as a "a red-shifted state" for the molecule, or "optical state I". In the case where the rotor 432 is rotated out of conjugation by approximately 90° with respect to the stators 434, the conjugation of the molecule 430 is broken and the HOMO and LUMO are localized over smaller portions of the molecule, referred to as "less-conjugated". This is a "blue-shifted state" of the molecule 430, or "optical state II". Thus, the colorant molecule 430 is reversibly switchable between two different optical states.

It will be appreciated by those skilled in the art that in the ideal case, when the rotor 432 and stators 434 are completely coplanar, then the molecule is fully conjugated, and when the rotor 432 is rotated at an angle of 90° with respect to the stators 434, then the molecule is non-conjugated. However, due to thermal fluctuations, these ideal states are not fully realized, and the molecule is thus referred to as being "more-conjugated" in the former case and "less-conjugated" in the latter case. Further, the terms "red-shifted" and "blue-shifted" are not meant to convey any relationship to hue, but rather the direction in the electromagnetic energy spectrum of the energy shift of the gap between the HOMO and LUMO states.

Examples 1 and 2 show two different orientations for switching the molecules. Example 1a below depicts a first generic molecular example for this Model 1.

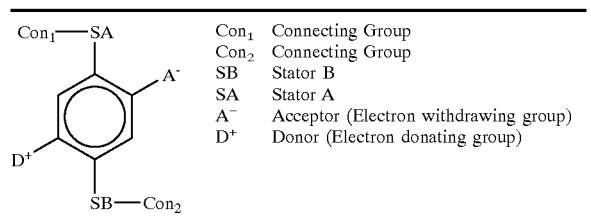

EXAMPLE 1a where:

The letter A⁻ represents an Acceptor group; it is an electron-withdrawing group. It may be one of the following: hydrogen, carboxylic acid or its derivatives, sulfuric acid or its derivatives, phosphoric acid or its derivatives, nitro, nitrile, hetero atoms (e.g., N, O, S, P, F, Cl, Br), or functional groups with at least one of above-mentioned hetero atoms (e.g., OH, SH, NH, etc.), hydrocarbons (either saturated or unsaturated) or substituted hydrocarbons.

The letter D⁺ represents a Donor group; it is an electron-donating group. It may be one of following: hydrogen, amine, OH, SH, ether, hydrocarbon (either saturated or unsaturated), or substituted hydrocarbon or functional group with at least one of hetero atom (e.g., B, Si, I, N, O, S, P). The donor is differentiated from the acceptor by that fact that it is less electronegative, or more electropositive, than the acceptor group on the molecule.

The letters $Con_1$ and $Con_2$ represent connecting units between one molecule and another molecule or between a molecule and the solid substrate (e.g., metal electrode, inorganic or organic substrate, etc.). They may be any one of the following: hydrogen (utilizing a hydrogen bond), multivalent hetero atoms (i.e., C, N, O, S, P, etc.) or functional groups containing these hetero atoms (e.g., NH, PH, etc.), hydrocarbons (either saturated or unsaturated) or substituted hydrocarbons.

The letters SA and SB are used here to designate Stator A and Stator B. They may be a hydrocarbon (either unsaturated or saturated) or substituted hydrocarbon. Typically, these hydrocarbon units contain conjugated rings that contribute to the extended conjugation of the molecule when it is in a planar state (red shifted state). In those stator units, they may contain the bridging group $G_n$ and/or the spacing group $R_n$. The bridging group (e.g., acetylene, ethylene, amide, imide, imine, azo, etc.) is typically used to connect the stator to the rotor or to connect two or more conjugated rings to achieve a desired chromophore. The connector may alternately comprise a single atom bridge, such as an ether bridge with an oxygen atom, or a direct sigma bond between the rotor and stator. The spacing groups (e.g., phenyl, isopropyl or tert-butyl, etc.) are used to provide an appropriate 3-dimensional scaffolding to allow the molecules to pack together while providing space for each rotor to rotate over the desired range of motion.

Example 1b below is a real molecular example of Model 1. In Example 1b, the rotation axis of the rotor is designed to be nearly perpendicular to the net current-carrying axis of the molecules, whereas in Example 2, the rotation axis is parallel to the orientation axis of the molecule. These designs allow different geometries of molecular films and electrodes to be used, depending on the desired results.

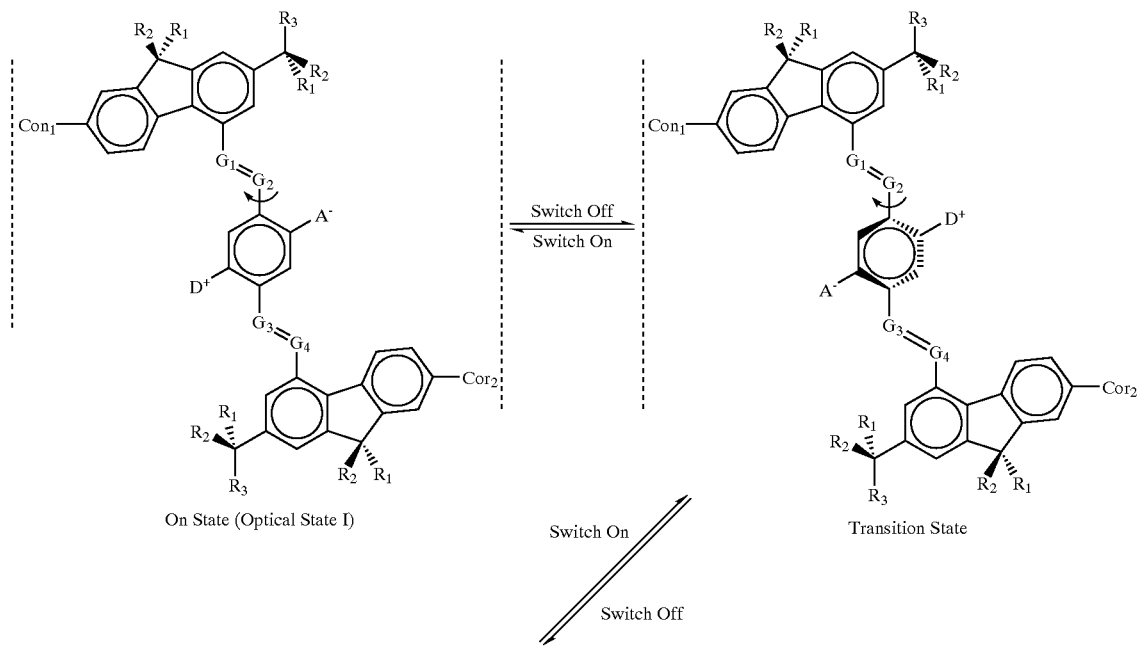

-continued

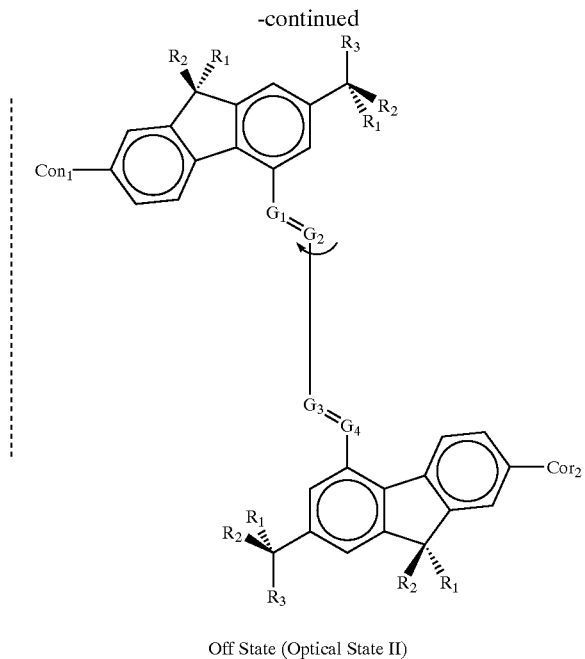

Off State (Optical State II)

EXAMPLE 1b where:

The letter $A^-$ is an Acceptor group; it is an electron-withdrawing group. It may be one of following: hydrogen, carboxylic acid or its derivatives, sulfuric acid or its derivatives, phosphoric acid or its derivatives, nitro, nitrile, hetero atoms (e.g., N, O, S, P, F, Cl, Br), or functional group with at least one of above-mentioned hetero atoms (e.g., OH, SH, NH, etc.), hydrocarbon (either saturated or unsaturated) or substituted hydrocarbon.

The letter $D^+$ represents a Donor group; it is an electron-donating group. It may be one of following: hydrogen, amine, OH, SH, ether, hydrocarbon (either saturated or unsaturated), or substituted hydrocarbon or functional group with at least one of hetero atom (e.g., B, Si, I, N, O, S, P). The donor is differentiated from the acceptor by that fact that it is less electronegative, or more electropositive, than the acceptor group on the molecule.

The letters $Con_1$ and $Con_2$ represent connecting units between one molecule and another molecule or between a molecule and the solid substrate (e.g. metal electrode, inorganic or organic substrate, etc.). They may be any one of the following: hydrogen (utilizing a hydrogen bond), multivalent hetero atoms (i.e., C, N, O, S, P, etc.) or functional groups containing these hetero atoms (e.g., NH, PH, etc.), hydrocarbons (either saturated or unsaturated) or substituted hydrocarbons.

Letters $R_1$, $R_2$, $R_3$ represent spacing groups built into the molecule. The function of these spacer units is to provide an appropriate 3-dimensional scaffolding to allow the molecules to pack together while providing rotational space for each rotor. They may be any one of the following: hydrogen, hydrocarbon (either saturated or unsaturated) or substituted hydrocarbon.

Letters $G_1$, $G_2$, $G_3$, and $G_4$ are bridging groups. The function of these bridging groups is to connect the stator and rotor or to connect two or more conjugated rings to achieve a desired chromophore. They may be any one of the following: hetero atoms (e.g., N, O, S, P, etc.) or functional groups with at least one of above-mentioned hetero atoms (e.g., NH or NHNH, etc.), hydrocarbons (either saturated or unsaturated) or substituted hydrocarbons. The connector may alternately comprise a single atom bridge such as an ether bridge with an oxygen atom, or a direct sigma bond between the rotor and stator.

In Example 1b above, the vertical dotted lines represent other molecules or solid substrates. The direction of the switching field is perpendicular to the vertical dotted lines. Such a configuration is employed for electrical switching; for optical switching, the linking moieties may be eliminated, and the molecule may be simply placed between the two electrodes. They may also be simply used to link one molecule to another molecule or a molecule to an organic or inorganic solid substrate.

Referring to FIG. 5a, the molecule shown above (Example 1b) has been designed with the internal rotor 432 perpendicular to the orientation axis of the entire molecule 430. In this case, the external field is applied along the orientation axis of the molecule 430 as pictured—the electrodes (vertical dotted lines) are oriented perpendicular to the plane of the paper and perpendicular to the orientation axis of the molecule 430. Application of an electric field oriented from left to right in the diagrams will cause the rotor 432 as pictured in the upper diagram to rotate to the position shown on the lower right diagram, and vice versa. In this case, the rotor 432 as pictured in the lower right diagram is not coplanar with the rest of the molecule, so this is the blue-shifted optical state of the molecule, whereas the rotor is coplanar with the rest of the molecule on the upper diagram, so this is the red-shifted optical state of the molecule. The structure shown in the lower left diagram depicts the transition state of rotation between the upper diagram (co-planar, conjugated) and the lower right diagram (central portion rotated, non-conjugated).

The molecule depicted in Example 1b is chromatically transparent or blue-shifted. In the conjugated state, the molecule is colored or is red-shifted.

For the molecules in Example 1b, a single monolayer molecular film is grown, for example using Langmuir-Blodgett techniques or self-assembled monolayers, such that the orientation axis of the molecules is perpendicular to the plane of the electrodes used to switch the molecules. Electrodes may be deposited in the manner described by Collier et al, supra, or methods described in the above-referenced patent applications and issued patent. Alternate thicker film deposition techniques include vapor phase deposition, contact or ink-jet printing, or silk screening.

Example 2a below depicts a second generic molecular example for this Model 1.

The letters $Con_1$ and $Con_2$ represent connecting units between one molecule and another molecule or between a molecule and the solid substrate (e.g., metal electrode, inorganic or organic substrate, etc.). They may be any one of the following: hydrogen (utilizing a hydrogen bond), multivalent hetero atoms (i.e., C, N, O, S, P, etc.) or functional groups containing these hetero atoms (e.g., NH, PH, etc.), hydrocarbons (either saturated or unsaturated) or substituted hydrocarbons.

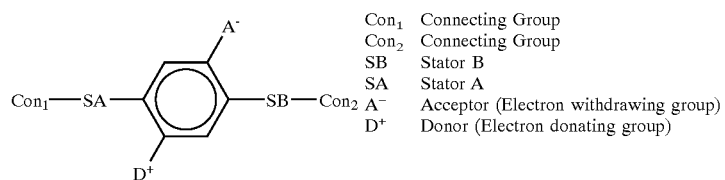

EXAMPLE 2a where:

The letter $A^-$ is an Acceptor group; it is an electron-withdrawing group. It may be one of following: hydrogen, carboxylic acid or its derivatives, sulfuric acid or its derivatives, phosphoric acid or its derivatives, nitro, nitrile, hetero atoms (e.g., N, O, S, P, F, Cl, Br), or functional group with at least one of above-mentioned hetero atoms (e.g., OH, SH, NH, etc.), hydrocarbon (either saturated or unsaturated) or substituted hydrocarbon.

The letter $D^+$ represents a Donor group; it is an electron-donating group. It may be one of following: hydrogen, amine, OH, SH, ether, hydrocarbon (either saturated or unsaturated), or substituted hydrocarbon or functional group with at least one of hetero atom (e.g., B, Si, I, N, O, S, P). The donor is differentiated from the acceptor by that fact that it is less electronegative, or more electropositive, than the acceptor group on the molecule.

The letters SA and SB are used here to designate Stator A and Stator B. They can be a hydrocarbon (either unsaturated or saturated) or substituted hydrocarbon. Typically, these hydrocarbon units contain conjugated rings that contribute to the extended conjugation of the molecule when it is in a planar state (red shifted state). In those stator units, they may contain bridging groups $G_n$ and/or spacing groups $R_n$. A bridging group is typically used to connect the stator and rotor or to connect two or more conjugated rings to achieve a desired chromophore The connector may alternately comprise a single atom bridge, such as an ether bridge with an oxygen atom, or a direct sigma bond between the rotor and stator. A spacing group provides an appropriate 3-dimensional scaffolding to allow the molecules to pack together while providing rotational space for each rotor.

Example 2b below is another real molecular example of Model 1.

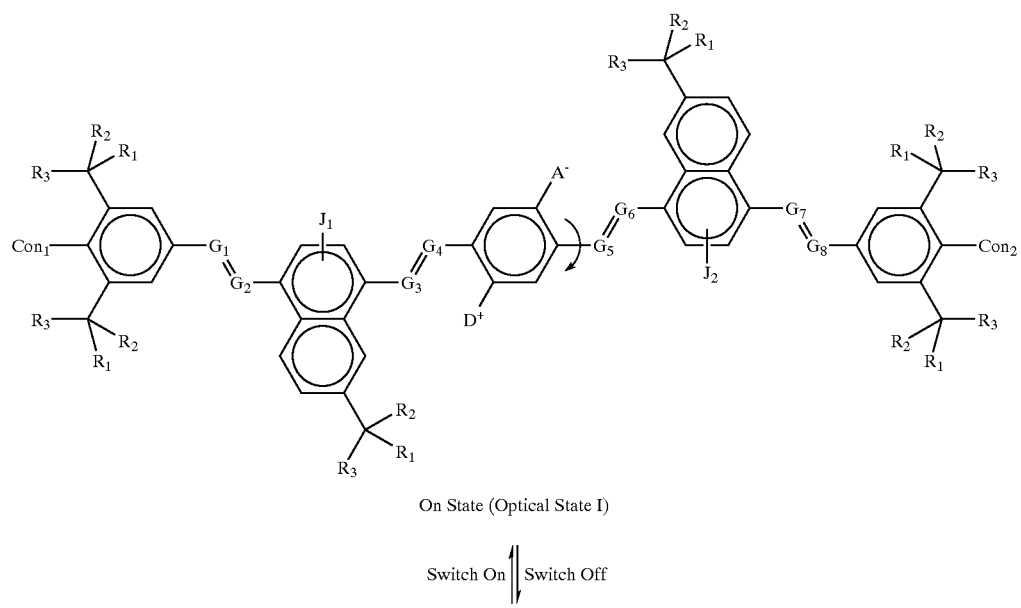

On State (Optical State I)

Switch On || Switch Off

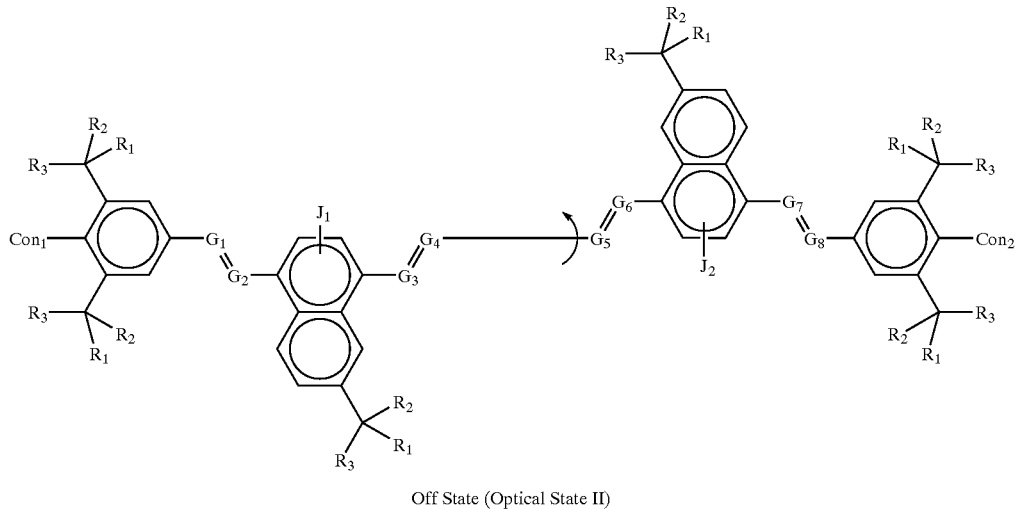

Off State (Optical State II)

EXAMPLE 2b where:

The letter A⁻ is an Acceptor group; it is an electron-withdrawing group. It may be one of following: hydrogen, carboxylic acid or its derivatives, sulfuric acid or its derivatives, phosphoric acid or its derivatives, nitro, nitrile, hetero atoms (e.g., N, O, S, P, F, Cl, Br), or functional group with at least one of above-mentioned hetero atoms (e.g., OH, SH, NH, etc.), hydrocarbon (either saturated or unsaturated) or substituted hydrocarbon.

The letter D⁺ represents a Donor group; it is an electron-donating group. It may be one of following: hydrogen, amine, OH, SH, ether, hydrocarbon (either saturated or unsaturated), or substituted hydrocarbon or functional group with at least one of hetero atom (e.g., B, Si, I, N, O, S, P). The donor is differentiated from the acceptor by that fact that it is less electronegative, or more electropositive, than the acceptor group on the molecule.

The letters $Con_1$ and $Con_2$ represent connecting units between one molecule and another molecule or between a molecule and the solid substrate (e.g., metal electrode, inorganic or organic substrate, etc.). They may be any one of the following: hydrogen (utilizing a hydrogen bond), multivalent hetero atoms (i.e., C, N, O, S, P, etc.) or functional groups containing these hetero atoms (e.g., NH, PH, etc.), hydrocarbons (either saturated or unsaturated) or substituted hydrocarbons.

The letters $R_1$, $R_2$ and $R_3$ represent spacing groups built into the molecule. The function of these spacer units is to provide an appropriate 3-dimensional scaffolding to allow the molecules to pack together while providing rotational space for each rotor. They may be any one of the following: hydrogen, hydrocarbon (either saturated or unsaturated) or substituted hydrocarbon.

The letters $G_1$, $G_2$, $G_3$, $G_4$, $G_5$, $G_6$, $G_7$, and $G_8$ are bridging groups. The function of these bridging groups is to connect the stator and rotor or to connect two or more conjugated rings to achieve a desired chromophore. They may be any one of the following: hetero atoms (e.g., C, N, O, S, P, etc.) or functional group with at least one of above-mentioned hetero atoms (e.g., NH or NHNH, etc.), hydrocarbons (either saturated or unsaturated) or substituted hydrocarbons. The connector may alternately comprise a single atom bridge such as an ether bridge with an oxygen atom, or a direct sigma bond between the rotor and stator.

The letters $J_1$ and $J_2$ represent tuning groups built into the molecule. The function of these tuning groups (e.g., OH, NHR, COOH, CN, nitro, etc.) is to provide an appropriate functional effect (e.g. both inductive effect and resonance effects) and/or steric effects. The functional effect is to tune the band gap ($\Delta E_{HOMO/LUMO}$) of the molecule to get the desired electronic as well as optical properties of the molecule. The steric effect is to tune the molecular conformation through steric hindrance, inter- or intra-molecular interaction forces (e.g. hydrogen bonding, Coulomb interaction, van der Waals forces) or to provide bi- or multiple-stability of molecular orientations. They may be any one of the following: hydrogen, hetero atoms (e.g., N, O, S, P, B, F, Cl, Br, and I), functional groups with at least one of above-mentioned hetero atoms, hydrocarbons (either saturated or unsaturated) or substituted hydrocarbons.

The molecule shown above (Example 2b) has been designed with the internal rotor parallel to the orientation axis of the entire molecule. In this case, the external field is applied perpendicular to the molecular axis—the electrodes are oriented parallel to the long axis of the molecule and can be either nominally perpendicular or parallel to the plane of the above model structures. For example, application of an electric field to the upper molecule shown above where the field lines are perpendicular to the molecular axis and pointing upward will cause the rotor as pictured in that diagram to rotate to approximately 90 degrees and appear edge on, as shown in the lower molecular diagram above, and vice versa. In this case, the rotor as pictured in the lower diagram is not coplanar with the rest of the molecule, so this is the blue-shifted optical state of the molecule, or optical state II, whereas the rotor is coplanar with the rest of the molecule on the upper diagram, so this is the red-shifted optical state of the molecule, or optical state I. The letters N, H, and O retain their usual meaning.).

FIG. 5a depicts molecules similar to those of Examples 1b and 2b, but simpler, comprising a middle rotor portion 432 and two end stator portions 434. As in Examples 1b and 2b, the rotor portion 432 comprises a benzene ring that is provided with substituents that render the rotor with a dipole. The two stator portions 434 are each covalently bonded to the benzene ring through an azo linkage, and both portions comprise an aromatic ring.

FIG. 5b is a schematic representation (perspective), illustrating the planar state, with the rotor 432 and stators 434 all co-planar. In the planar state, the molecule 430 is fully conjugated, evidences color (first spectral or optical state), and is comparatively more electrically conductive. The conjugation of the rings is illustrated by the π-orbital clouds 500a, 500b above and below, respectively, the plane of the molecule 430.

FIG. 5c is also a schematic representation (perspective), illustrating the rotated state, with the rotor 432 rotated 90° with respect to the stators 434, which remain co-planar. In the rotated state, the conjugation of the molecule 430 is broken. Consequently, the molecule 430 is transparent (second spectral or optical state) and comparatively less electrically conductive.

For the molecules of Example 2b, the films are constructed such that the molecular axis is parallel to the plane of the electrodes. This may involve films that are multiple monolayers thick. The molecules form solid-state or liquid crystals in which the large stator groups are locked into position by intermolecular interactions or direct bonding to a support structure, but the rotor is small enough to move within the lattice of the molecules. This type of structure can be used to build an E-field controlled display or used for other applications as mentioned earlier herein.

Model (2a): E-Field Induced Band Gap Change Caused by the Change of Extended Conjugation Via Charge Separation or Recombination Accompanied by Increasing or Decreasing Band Localization:

FIG. 6a is a schematic depiction of this model, which involves an E-field-induced band gap change caused by the change of extended conjugation via charge separation or recombination accompanied by increasing or decreasing band localization. As shown in FIG. 6a, the molecule 630 comprises two portions 632 and 634. The molecule 630 evidences a larger band gap state, with less π-delocalization. Application of an electric field causes charge separation in the molecule 630, resulting in a smaller band gap state, with better π-delocalization. Recombination of the charges returns the molecule 630 to its original state.

The following requirements must be met in this model:

(a) The molecule must have a modest dielectric constant $\epsilon_r$ and can be easily polarized by an external E-field, with $\epsilon_r$ in the range of 2 to 10 and polarization fields ranging from 0.01 to 10 V/nm;

(b) At least one segment of the molecule must have non-bonding electrons, or π-electrons, or π-electrons and non-bonding electrons that can be mobilized over the entire molecule or a part of the molecule;

(c) The molecule can be symmetrical or asymmetrical;

(d) The inducible dipole(s) of the molecule can be oriented in at least one direction;

(e) The charges will be separated either partially or completely during E-field induced polarization;

(f) The states of charge separation or recombination can be E-field dependent or bi-stable, stabilized through inter- or intra-molecular forces such as covalent bond formation, hydrogen bonding, charge attraction, Coulomb forces, metal complex, or Lewis acid (base) complex, etc.;

(g) The process of charge separation or recombination of the molecule can involve or not involve σ- and π-bond breakage or formation; and (h) During the charge separation or recombination process activated by an E-field, the band gap of the molecule will change depending on the degree of the non-bonding electron, or π-electron, or π-electron and non-bonding electron de-localization in the molecule. Both optical and electrical properties of the molecules will be changed accordingly.

One example of an E-field induced band gap change (color change) via charge separation or recombination involving bond breaking or bond formation is shown below (Example 3):

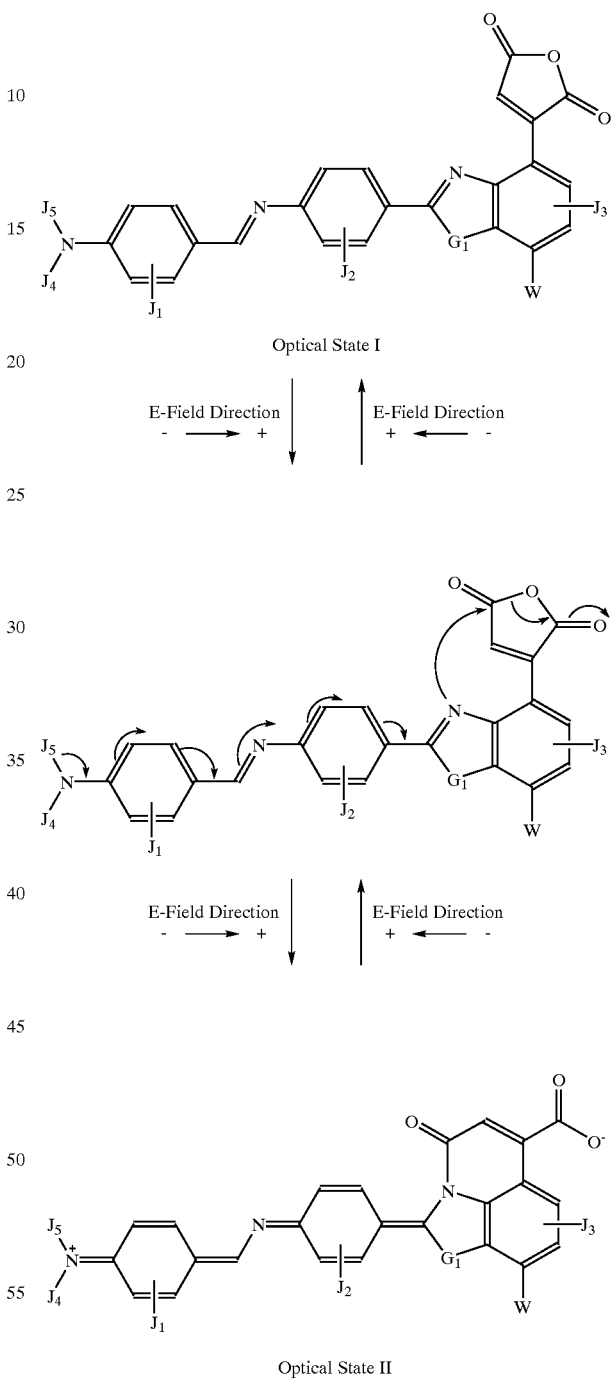

EXAMPLE 3 where:

The letters $J_1$, $J_2$, $J_3$, $J_4$ and $J_5$ represent tuning groups built into the molecule. The function of these tuning groups (e.g., OH, NHR, COOH, CN, nitro, etc.) is to provide an appropriate functional effect (e.g., both inductive effect and resonance effects) and/or steric effects. The functional effect is to tune the band gap ($\Delta E_{HOMO/LUMO}$) of the molecule to get the desired electronic as well as optical properties of the molecule. The steric effect is to tune the molecule conformation through steric hindrance, inter- or intra-molecular interaction forces (e.g., hydrogen bonding, Coulomb interaction, van der Waals forces) to provide bi- or multiple-stability of molecular orientation. They may be any one of the following: hydrogen, hetero atom (e.g., N, O, S, P, B, F, Cl, Br and 1), functional group with at least one of above-mentioned hetero atoms, hydrocarbon (either saturated or unsaturated) or substituted hydrocarbon.

The letter $G_1$ is a bridging group. The function of the bridging group is to connect two or more conjugated rings to achieve a desired chromophore. The bridging group may be any one of the following: hetero atoms (e.g., N, O, S, P, etc.) or functional group with at least one of above-mentioned hetero atoms (e.g., NH, etc.), hydrocarbon or substituted hydrocarbon.

The letter W is an electron-withdrawing group. The function of this group is to tune the reactivity of the maleic anhydride group of this molecule, which enables the molecule to undergo a smooth charge separation or recombination (bond breaking or formation, etc.) under the influence of an applied external E-field. The electron-withdrawing group may be any one of the following: carboxylic acid or its derivatives (e.g., ester or amide etc.), nitro, nitrile, ketone, aldehyde, sulfone, sulfuric acid or its derivatives, hetero atoms (e.g., F, Cl, etc.) or functional group with at least one of the hetero atoms (e.g., F, Cl, Br, N, O, S, etc.).

An example of an E-field induced band gap change involving the formation of a molecule-metal complex or a molecule-Lewis acid complex is shown below (Example 4):

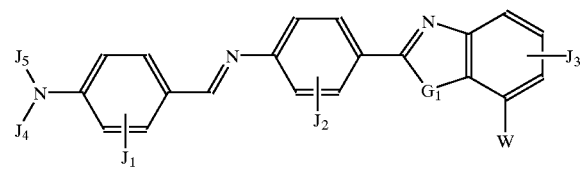

Optical State I
Eg (HOMO/LUMO) = 3.46eV
(When $R_1 = R_2 = R_4 = R_5 = H; R_3 = CH_3$)

M+ (M = H, Lewis Acid)

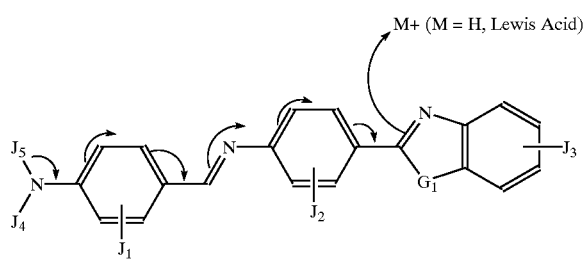

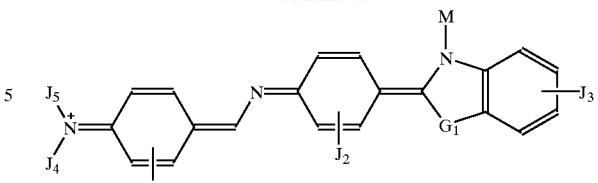

Optical State II
Eg (HOMO/LUMO) = 2.04 eV
(When $R_1 = R_2 = R_4 = R_5 = H; R_3 = CH_3$)

EXAMPLE 4 where:

The letters $J_1$, $J_2$, $J_3$, $J_4$ and $J_5$ represent tuning groups built into the molecule. The function of these tuning groups (e.g., OH, NHR, COOH, CN, nitro, etc.) is to provide an appropriate functional effect (e.g. both inductive and resonance effects) and/or steric effects. The functional effect is to tune the band gap ($\Delta E_{HOMO/LUMO}$) of the molecule to get the desired electronic as well as optical properties of the molecule. The steric effect is to tune the molecular conformation through steric hindrance, inter- or intra-molecular interaction forces (e.g., hydrogen bonding, Coulomb interaction, van der Waals forces) to provide bi- or multiple-stability of the molecular orientation. They may be any one of the following: hydrogen, hetero atom (e.g., N, O, S, P, B, F, Cl, Br, and I), functional group with at least one of the above-mentioned hetero atoms, hydrocarbon (either saturated or unsaturated) or substituted hydrocarbon.

The letter $G_1$ is a bridging group. The function of the bridging group is to connect two or more conjugated rings to achieve a desired chromophore. The bridging group may be any one of the following: hetero atoms (e.g., N, O, S, P, etc.) or functional group with at least one of above-mentioned hetero atoms (e.g., NH, etc.) or substituted hydrocarbon.

$M^+$ represents metals, including transition metals, or their halogen complexes or $H^+$ or other type of Lewis acid(s).

Model (2b): E-Field Induced Band Gap Change Caused by the Change of Extended Conjugation via Charge Separation or Recombination and π-Bond Breaking or Formation:

FIG. 6b is a schematic depiction of this model, which involves an E-field-induced band gap change caused by the change of extended conjugation via charge separation or recombination and π-bond breaking or formation. As shown in FIG. 6b, the molecule 630' comprises two portions 632' and 634'. The molecule 630' evidences a smaller band gap state. Application of an electric field causes breaking of the π-bond in the molecule 630', resulting in a larger band gap state. Reversal of the E-field re-connects the π-bond between the two portions 632' and 634' and returns the molecule 630' to its original state.

The requirements that must be met in this model are the same as listed for Model 2(a).

One example of an E-field induced band gap change cause by extended conjugation via charge separation (σ-bond breaking and π-bond formation) is shown below (Example 5):

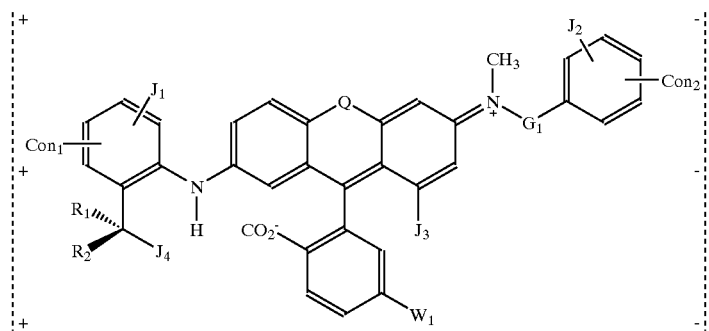
↑
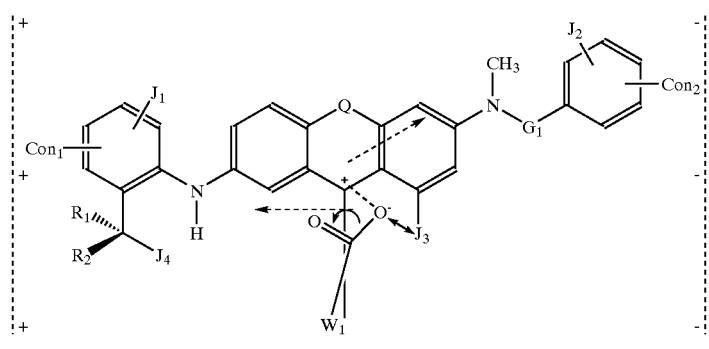
↑
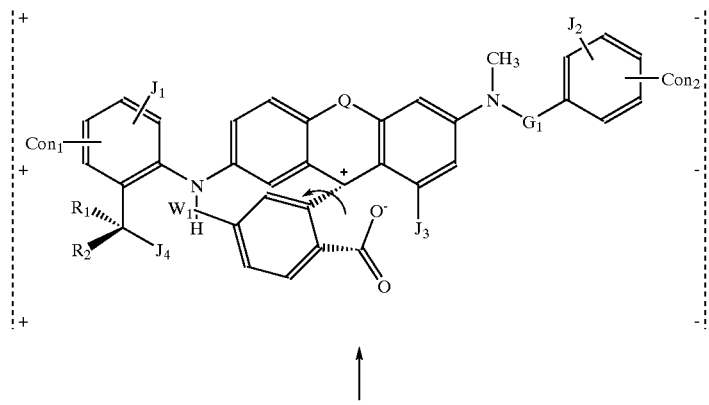
↑
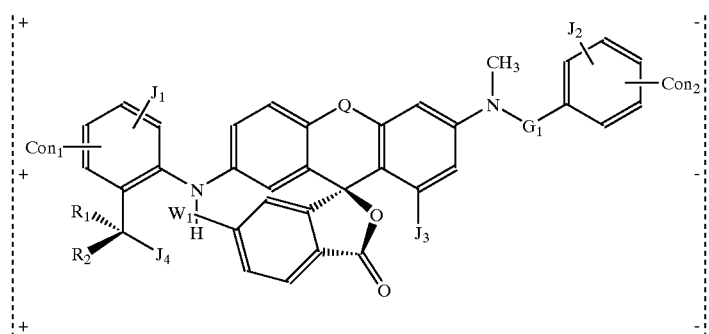

EXAMPLE 5 where:

The letter Q is used here to designate a connecting unit between two phenyl rings. It can be any one of following: S, O, NH, NR, hydrocarbon, or substituted hydrocarbon.

The letters $Con_1$ and $Con_2$ are connecting groups between one molecule and another molecule or between a molecule and a solid substrate (e.g., metal electrode, inorganic or organic substrate, etc.). They may be any one of the following: hydrogen (through a hydrogen bond), hetero atoms (i.e., N, O, S, P, etc.) or functional groups with at least one of above-mentioned hetero atoms (e.g., NH, etc.), hydrocarbons (either saturated or unsaturated) or substituted hydrocarbons.

The letters $R_1$ and $R_2$ represent spacing groups built into the molecule. The function of these spacer units is to provide an appropriate 3-dimensional scaffolding to allow the molecules to pack together while providing rotational space for each rotor. They may be any one of the following: hydrogen, hydrocarbons (either saturated or unsaturated) or substituted hydrocarbons.

The letters $J_1$, $J_2$, $J_3$ and $J_4$ represent tuning groups built into the molecule. The function of these tuning groups (e.g., OH, NHR, COOH, CN, nitro, etc.) is to provide an appropriate functional effect (e.g. both inductive and resonance effects) and/or steric effects. The functional effect is to tune the band gap ($\Delta E_{HOMO/LUMO}$) of the molecule to get the desired electronic as well as optical properties of the molecule. The steric effect is to tune the molecular conformation through steric hindrance, inter- or intra-molecular interaction forces (e.g., hydrogen bonding, Coulomb interaction, van der Waals forces) to provide bi- or multiple-stability of molecular orientation. They may also be used as spacing group to provide an appropriate 3-dimensional scaffolding to allow the molecules to pack together while providing rotational space for each rotor. They may be any one of the following: hydrogen, hetero atom (e.g., N, O, S, P, B, F, Cl, Br, and I), functional group with at least one of above-mentioned hetero atom, hydrocarbon (either saturated or unsaturated) or substituted hydrocarbon.

The letter $G_1$ is a bridging group. The function of the bridging group is to connect the stator and rotor or to connect two or more conjugated rings to achieve a desired chromophore. The bridging group may be any one of the following: hetero atoms (e.g., N, O, S, P, etc.) or functional groups with at least one of above-mentioned hetero atoms (e.g., NH or NHNH, etc.), hydrocarbon (either saturated or unsaturated) or substituted hydrocarbon.

The letter W is an electron-withdrawing group. The function of this group is to tune the reactivity of the lactone group of this molecule, which enables the molecule to undergo a smooth charge separation or recombination (bond breaking or formation, etc.) under the influence of an applied external E-field. The electron-withdrawing group may be any one of the following: carboxylic acid or its derivatives (e.g., ester or amide etc.), nitro, nitrile, ketone, aldehyde, sulfone, sulfuric acid or its derivatives, hetero atoms (e.g., F, Cl, etc.) or functional group with at least one of hetero atoms (e.g., F, Cl, Br, N, O and S, etc.), hydrocarbon (either saturated or unsaturated) or substituted hydrocarbon.

The uppermost molecular structure has a smaller band gap state than the lowermost molecular structure.

Another example of an E-field induced band gap change caused by breakage of extended π-bond conjugation via charge recombination and σ-bond formation is shown below (Example 6):

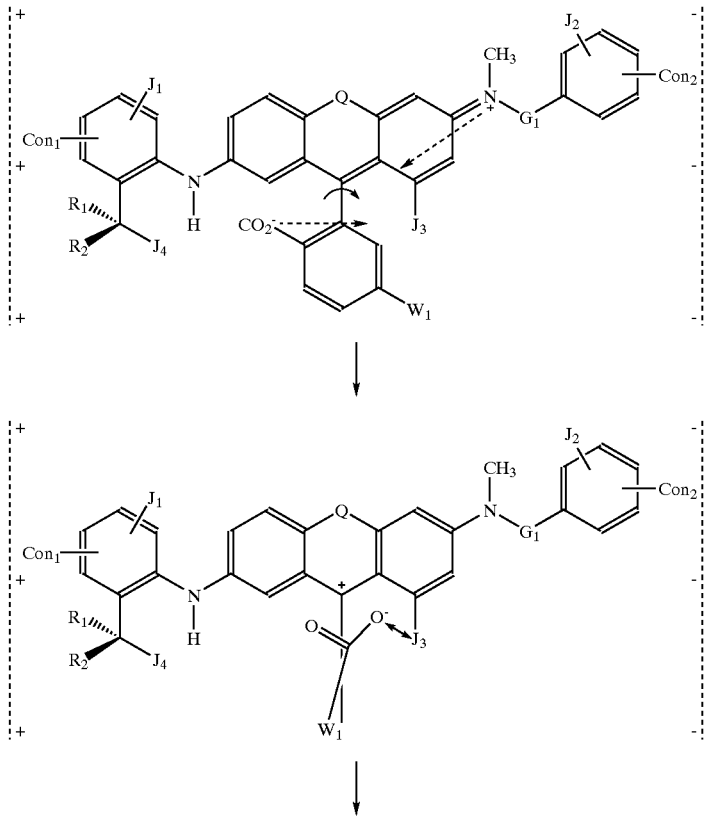

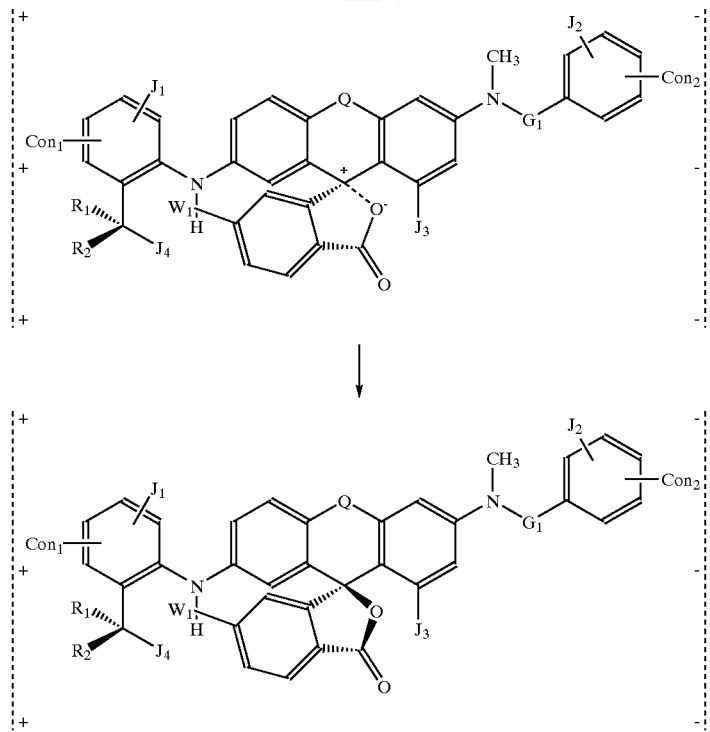

EXAMPLE 6 where:

The letter Q is used here to designate a connecting unit between two phenyl rings. It can be any one of following: S, O, NH, NR, hydrocarbon, or substituted hydrocarbon.

The letters $Con_1$ and $Con_2$ are connecting groups between one molecule and another molecule or between a molecule and a solid substrate (e.g., metal electrode, inorganic or organic substrate, etc.). They may be any one of the following: hydrogen, hetero atoms (i.e., N, O, S, P, etc.) or functional group with at least one of above-mentioned hetero atoms (e.g., NH, etc.), hydrocarbon (either saturated or unsaturated) or substituted hydrocarbon.

The letters $R_1$ and $R_2$ represent spacing groups built into the molecule. The function of these spacer units is to provide an appropriate 3-dimensional scaffolding to allow the molecules to pack together while providing rotational space for each rotor. They may be any one of the following: hydrogen, hydrocarbon (either saturated or unsaturated) or substituted hydrocarbon.

The letters $J_1$, $J_2$, $J_3$ and $J_4$ represent tuning groups built into the molecule. The function of these tuning groups (e.g., OH, NHR, COOH, CN, nitro, etc.) is to provide an appropriate functional effect (e.g., both inductive and resonance effects) and/or steric effects. The functional effect is to tune the band gap ($\Delta E_{HOMO/LUMO}$) of the molecule to get the desired electronic as well as optical properties of the molecule. The steric effect is to tune the molecule conformation through steric hindrance, inter- or intra-molecular interaction forces (e.g. hydrogen bonding, Coulomb interaction, van der Waals forces) to provide bi- or multiple-stability of molecular orientation. They may also be used as spacing groups to provide an appropriate 3-dimensional scaffolding to allow the molecules to pack together while providing rotational space for each rotor. They may be any one of the following: hydrogen, hetero atom (e.g., N, O, S, P, B, F, Cl, Br, and I), functional groups with at least one of above-mentioned hetero atom, hydrocarbon (either saturated or unsaturated) or substituted hydrocarbon.

The letter $G_1$ is a bridging group. The function of this bridging group is to connect stator and rotor or to connect two or more conjugated rings to achieve a desired chromophore. The bridging group may be any one of the following: hetero atoms (e.g., N, O, S, P, etc.) or functional group with at least one of above-mentioned hetero atoms (e.g., NH or NHNH, etc.), hydrocarbon (either saturated or unsaturated) or substituted hydrocarbon.

The letter W is an electron-withdrawing group. The function of this group is to tune the reactivity of the lactone group of this molecule, which enables the molecule to undergo a smooth charge separation or recombination (bond breaking or formation, etc.) under the influence of an applied external E-field. The electron-withdrawing group may be any one of the following: carboxylic acid or its derivatives (e.g., ester or amide, etc.), nitro, nitrile, ketone, aldehyde, sulfone, sulfuric acid or its derivatives, hetero atoms (e.g., F, Cl etc.) or functional group with at least one of hetero atoms (e.g., F, Cl, Br, N, O, S, etc.), hydrocarbon (either saturated or unsaturated) or substituted hydrocarbon.

Again, the uppermost molecular structure has a smaller band gap state than the lowermost molecular structure.

The present invention turns ink or dye molecules into active devices that can be switched with an external electric field by a mechanism completely different from any previously described electro-chromic or chromogenic material. The general idea is to use modified Crystal Violet lactone type of molecules in which the C—O bond of the lactone is sufficiently labile enough and can undergo a bond breaking and forming (see Examples 5 and 6 above) under the influence of an applied electric field.

A positive and a negative charge are generated during the C—O bond breaking process. The resulting charges will be separated and move in opposite directions parallel to the applied external field (upper part of the molecule), or bond rotation (lower part of the molecule. The two aromatic rings with an extended dipole (upper part and lower part) of the molecule is completely conjugated, and a color (red-shift) results (see Example 5). However, the molecule is designed to have inter- and/or intra-molecular forces, such as hydrogen bonding, Coulomb, or dipole-dipole interactions as well as steric repulsions, or by a permanent external E-field to stabilize both charges in this particular orientation. Thus, a large field is required to unlatch the molecule from its initial orientation. Once switched into a particular orientation, the molecule will remain in that orientation until it is switched out.

When a reverse E-field is applied (Example 6), both charges tend to realign themselves to the direction of the reverse external field. The positive charge on the upper part of the molecule will migrate to the center part of the molecule (tri-aryl methane position) from the side of the molecule through the non-bonding electron, or $\pi$-electron, or $\pi$-electron and non-bonding electron delocalization. Likewise, the negative charged lower part of the molecule will tend to move closer to the external E-field through C—C bond rotation. A key component of the molecule design is that there is a steric and static repulsion between the $CO_2^-$ and the $J_3$ and $J_4$ groups that will prevent the lower part of the molecule (the negative charged sector) from rotating through a complete 180 degree half cycle. Instead, the rotation is halted by the steric interaction of bulky groups on the lower part and the upper part at an angle of approximately 90 degrees from the initial orientation. Furthermore, this 90 degree orientation is stabilized by a C—O bond formation and charge recombination. During this process, a tetrahedral carbon (an isolator) is formed at the tri-aryl methane position. The conjugation of the molecule is broken and the HOMO and LUMO are no longer delocalized over the entire upper part of the molecule. This has the effect of shrinking the size of the volume occupied by the electrons, which causes the HOMO-LUMO gap to increase. A blue-shifted color or transparent state will result during this process.

For colored ink and dye molecules, the limitation of the positive charge migration just between one side of a molecule and the center position is crucial. Another important factor is the ability to switch the rotor (lower part of molecule) between two states separated by an optically significant angle (nominally 10 to 170 degrees) from the stators (the upper part of the molecule). When the intramolecular charge separation reaches a maximum distance, then the upper most part of the molecule becomes completely conjugated. Thus, the $\pi$-electrons or $\pi$-electrons and non-bonding electrons of the molecule, through its highest occupied molecular orbital (HOMO) and lowest unoccupied molecular orbital (LUMO), are delocalized over the upper most region. The effect is identical to that for a quantum mechanical particle in a box: when the box is the size of the entire molecule, i.e., when the orbitals are delocalized, then the gap between the HOMO and LUMO is relatively small. In this case, the HOMO-LUMO gap of the molecule is designed to yield the desired color of the ink or dye. The HOMO-LUMO gap for the all-parallel structure can be tuned by substituting various chemical groups ($J_1$, $J_2$, $J_3$, $J_4$, and W) onto the different aromatic rings of the molecule. In the case where the rotor (lower part of the molecule) is rotated by 10 to 170 degrees with respect to the stators (the upper part of the molecule), depending on the nature of the chemical substituents ($J_1$, $J_2$, $J_3$, $J_4$, and W) bonded to the rotor and stator, then the increased HOMO-LUMO gap will correspond to a color that is blue-shifted with respect to the color of the all-parallel structure. With sufficient shifting, the molecule becomes transparent, if the new HOMO-LUMO gap is large enough. Thus, the molecule is switchable between two colors or from one color to a transparent state.

Examples 5 and 6 show two different states of a representative switchable molecule under the influence of an externally applied E-field. For this particular type of molecule, a sufficiently thick molecular film is grown, for example using Langmuir-Blodgett techniques, vapor phase deposition, or electrochemical deposition, such that the orientation axis of the molecules is perpendicular to the plane of the electrodes used to switch the molecules. Another deposition technique is to suspend the molecule as a monomer/oligomer or solvent-based solution that is thick film coated (e.g., reverse roll) or spin-coated onto the substrate and subsequently polymerized (e.g., by UV radiation) or dried while the coating is subjected to an electric field that orients the molecule. A top electrode may be a transparent conductor, such as indium-tin oxide, and the films are grown such that the molecular axis is parallel to the plane of the electrodes. The molecules form solid-state or liquid crystals in which the large stator groups are locked into position by intermolecular interactions or direct bonding to a support structure, but the rotor is small enough to move within the lattice of the molecules.

Model (3): E-Field Induced Band Gap Change via Molecular Folding or Stretching

FIG. 7 is a schematic depiction of this model, which involves an E-field-induced band gap change caused by the change of extended conjugation via molecular folding or stretching. As shown in FIG. 7, the molecule 730 comprises three portions 732, 734, and 736. The molecule 730 evidences a smaller band gap state due to an extended conjugation through a large region of the molecule. Application of an electric field causes breaking of the conjugation in the molecule 730, due to molecular folding about the central portion 734, resulting in a larger band gap state due to the non-extended conjugation in the large region of the molecule. Reversal of the E-field unfolds the molecule 730 and returns the molecule to its original state. Stretching and relaxing of the central portion 734 of the molecule 730 has the same effect.

The following requirements must be met in this Model:

(a) The molecule must have at least two segments;

(b) Several segments (portions) should have non-bonding electrons, or $\pi$-electrons, or $\pi$-electrons and non-bonding electrons involved in the HOMOs, LUMOs, and nearby orbitals;

(c) The molecule may be either symmetrical or asymmetrical with a donor group on one side and an acceptor group on another side;

(d) At least two segments of the molecule have some functional groups that will help to stabilize both states of folding and stretching through intra- or inter-molecular forces such as hydrogen bonding, van der Waals forces, Coulomb attraction or metal complex formation;

(e) The folding or stretching states of the molecule must be E-field addressable;

(f) In at least one state (presumably in a fully stretched state), the non-bonding electrons, or $\pi$-electrons, or $\pi$-electrons and non-bonding electrons of the molecule will be well-delocalized, and the $\pi$- and p-electrons electrons of the molecule will be localized or only partially delocalized in other state(s);

(g) The band gap of the molecules will change depending on the degree of non-bonding electron, or $\pi$-electron, or $\pi$-electron and non-bonding electron delocalization while the molecule is folded or stretched by an applied external E-field, and this type of change will also affect the electrical or optical properties of the molecule as well; and (h) This characteristic can be applied to these types of molecules for optical or electrical switches, gates, storage or display applications.

An example of an E-field induced band gap change via molecular folding or stretching is shown below (Example 7):

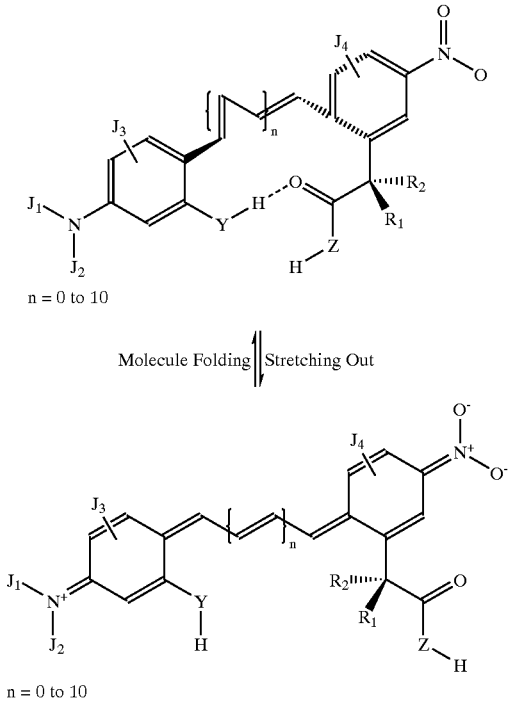

EXAMPLE 7 where:

The letters $R_1$ and $R_2$ represent spacing groups built into the molecule. They may be any one of the following: hydrogen, hydrocarbon (either saturated or unsaturated) or substituted hydrocarbon.

The letters $J_1$, $J_2$, $J_3$, $J_4$ and $J_5$ represent tuning groups built into the molecule. The function of these tuning groups (e.g., OH, NHR, COOH, CN, nitro, etc.) is used to provide an appropriate functional effect (e.g., both inductive and resonance effects) and/or steric effects. The functional effect is to tune the band gap ($\Delta E_{HOMO/LUMO}$) of the molecule to get the desired electronic as well as optical properties of the molecule. The steric effect is to tune the molecular conformation through steric hindrance, inter- or intra-molecular interaction forces (e.g. hydrogen bonding, Coulomb interaction, van der Waals forces) to provide bi- or multiple-stability of molecular orientation. They may also be used as spacing group They may be any one of the following: hydrogen, hetero atom (e.g., N, O, S, P, B, F, Cl, Br and I), functional group with at least one of above-mentioned hetero atom, hydrocarbon (either saturated or unsaturated) or substituted hydrocarbon.

Letters Y and Z are functional groups that will form inter- or intra-molecular hydrogen bonding. They may be any one of following: SH, OH, amine, hydrocarbon, or substituted hydrocarbon.

The molecule on the top of the graphic has a larger band gap due to the localized conjugation various parts of the molecule, while the molecule on the bottom has a smaller band gap due to an extended conjugation through a large region of the molecule.

The technology disclosed and claimed herein for forming optical switches (micro-meter or nanometer) may be used to assemble displays, electronic books, rewrittable media, electrically tunable optical lenses, electrically controlled tinting for windows and mirrors, optical crossbar switches for routing signals from one of many incoming channels to one of many outgoing channels, and more.

INDUSTRIAL APPLICABILITY

The field-switchable molecules disclosed herein are expected to find use in optical devices constructed from micro-scale and even nano-scale components as well as a variety of visual displays.

What is claimed is:

1. A molecular system capable of undergoing an electric field induced band gap change that occurs via one of the following mechanisms:
    (1) molecular conformation change or an isomerization;
    (2) change of extended conjugation via chemical bonding change to change the band gap; or
    (3) molecular folding or stretching.

2. The molecular system of claim 1 wherein said electric field induced band gap change occurs via molecular conformation change or an isomerization.

3. The molecular system of claim 2 comprising at least one stator portion and at least one rotor portion, wherein said rotor rotates from a first state to a second state with an applied electric field, wherein in said first state, there is extended conjugation throughout said molecular system, resulting in a relatively smaller band gap, and wherein in said second state, said extended conjugation is changed, resulting in a relatively larger band gap.

4. The molecular system of claim 3 comprising:

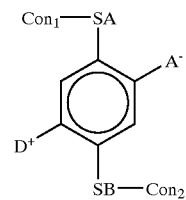

where:

$A^-$ is an Acceptor group comprising an electron-withdrawing group selected from the group consisting of: (a) hydrogen, (b) carboxylic acid and its derivatives, (c) sulfuric acid and its derivatives, (d) phosphoric acid and its derivatives, (e) nitro, (f) nitrile, (g) hetero atoms selected from the group consisting of N, O, S, P, F, Cl, and Br, (h) functional groups with at least one of said hetero atoms, (i) saturated or unsaturated hydrocarbons, and (j) substituted hydrocarbons;

$D^+$ is a Donor group comprising an electron-donating group selected from the group consisting of: (a) hydrogen, (b) amines, (c) OH, (d) SH, (e) ethers, (f) saturated or unsaturated hydrocarbon, (g) substituted hydrocarbons, and (h) functional groups with at least one hetero atom selected from the group consisting of B, Si, I, N, O, S, and P, wherein said Donor group is more electropositive than said Acceptor group;

$Con_1$ and $Con_2$ are connecting units between one molecule and another molecule or between a molecule and a solid substrate selected from the group consisting of a metal electrode, an inorganic substrate, and an organic substrate, said connecting units independently selected from the group consisting of: (a) hydrogen (utilizing a hydrogen bond), (b) multivalent hetero atoms selected from the group consisting of C, N, O, S, and P, (c) functional groups containing said hetero atoms, (d) saturated or unsaturated hydrocarbons, and (e) substituted hydrocarbons; and SA and SB designate Stator A and Stator B, respectively, which may be the same or different and which are independently selected from the group consisting of (a) unsaturated or saturated hydrocarbons and (b) substituted hydrocarbons, wherein said hydrocarbon units contain conjugated rings that contribute to an extended conjugation of the molecule when it is in a planar state (red shifted state), wherein said stators optionally and separately contain at least one bridging group $G_n$, at least one spacing group $R_n$, or both, wherein said at least one bridging group is either (a) selected from the group consisting of acetylene, ethylene, amide, imide, imine, and azo and is used to connect said stators to said rotor or to connect at least two conjugated rings to achieve a desired chromophore or (b) selected from the group consisting of a single atom bridge and a direct sigma bond between said rotor and said stators and wherein said at least one spacing group is selected from the group consisting of phenyl, isopropyl, and tert-butyl and is used to provide an appropriate 3-dimensional scaffolding to allow molecules to pack together while providing rotational space for each rotor to rotate over a desired range of motion.

5. The molecular system of claim 4 comprising:

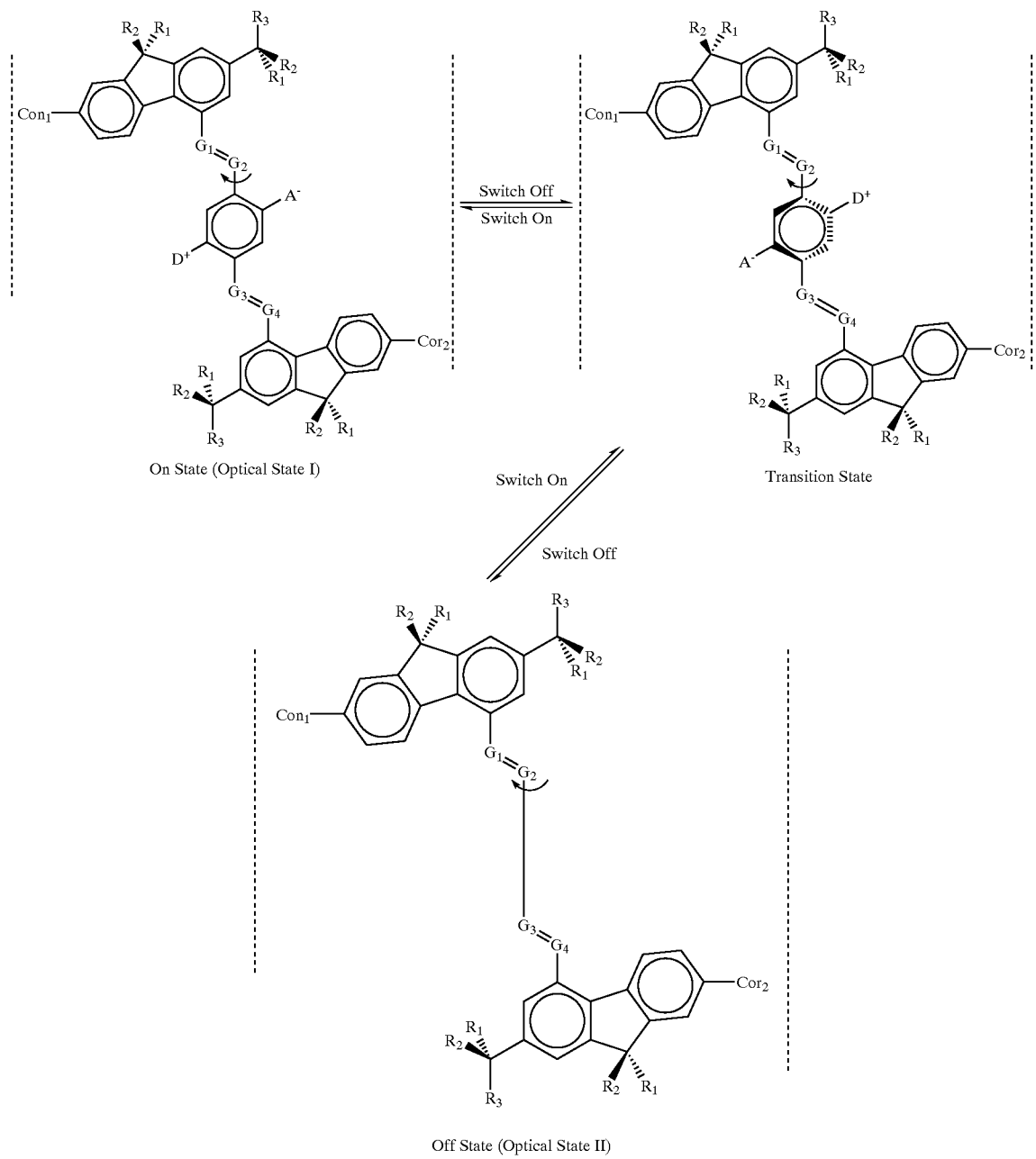

where:
- A⁻ is said Acceptor group;
- D⁺ is said Donor group;
- $Con_1$ and $Con_2$ are said connecting units;
- $R_1$, $R_2$, $R_3$ are said spacing groups, which are independently selected from the group consisting of: (a) hydrogen, (b) saturated or unsaturated hydrocarbons, and (c) substituted hydrocarbons; and
- $G_1$, $G_2$, $G_3$, and $G_4$ are said bridging groups, which are independently selected from the group consisting of: (a) hetero atoms selected from the group consisting of N, O, S, and P, (b) functional groups with at least one of said hetero atoms, (c) saturated or unsaturated hydrocarbons, and (d) substituted hydrocarbons.

6. The molecular system of claim 3 comprising:

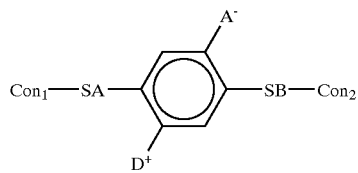

where:
- A⁻ is an Acceptor group comprising an electron-withdrawing group selected from the group consisting of: (a) hydrogen, (b) carboxylic acid and its derivatives, (c) sulfuric acid and its derivatives, (d) phosphoric acid and its derivatives, (e) nitro, (f) nitrile, (g) hetero atoms selected from the group consisting of N, O, S, P, F, Cl, and Br, (h) functional groups with at least one of said hetero atoms, (i) saturated or unsaturated hydrocarbons, and (j) substituted hydrocarbons;
- D⁺ is a Donor group comprising an electron-donating group selected from the group consisting of: (a) hydrogen, (b) amines, (c) OH, (d) SH, (e) ethers, (f) saturated or unsaturated hydrocarbon, (g) substituted hydrocarbons, and (h) functional groups with at least one hetero atom selected from the group consisting of B, Si, I, N, O, S, and P, wherein said Donor group is more electropositive than said Acceptor group;
- $Con_1$ and $Con_2$ are connecting units between one molecule and another molecule or between a molecule and a solid substrate selected from the group consisting of a metal electrode, an inorganic substrate, and an organic substrate, said connecting units independently selected from the group consisting of: (a) hydrogen (utilizing a hydrogen bond), (b) multivalent hetero atoms selected from the group consisting of C, N, O, S, and P, (c) functional groups containing said hetero atoms, (d) saturated or unsaturated hydrocarbons, and (e) substituted hydrocarbons; and
- SA and SB designate Stator A and Stator B, respectively, which may be the same or different and which are independently selected from the group consisting of (a) unsaturated or saturated hydrocarbons and (b) substituted hydrocarbons, wherein said hydrocarbon units contain conjugated rings that contribute to an extended conjugation of the molecule when it is in a planar state (red shifted state), wherein said stators optionally and separately contain at least one bridging group $G_n$, at least one spacing group $R_n$, or both, wherein said at least one bridging group is either (a) selected from the group consisting of acetylene, ethylene, amide, imide, imine, and azo and is used to connect said stators to said rotor or to connect at least two conjugated rings to achieve a desired chromophore or (b) selected from the group consisting of a single atom bridge and a direct sigma bond between said rotor and said stators and wherein said at least one spacing group is selected from the group consisting of phenyl, isopropyl, and tert-butyl and is used to provide an appropriate 3-dimensional scaffolding to allow molecules to pack together while providing rotational space for each rotor to rotate over a desired range of motion.

7. The molecular system of claim 6 comprising:

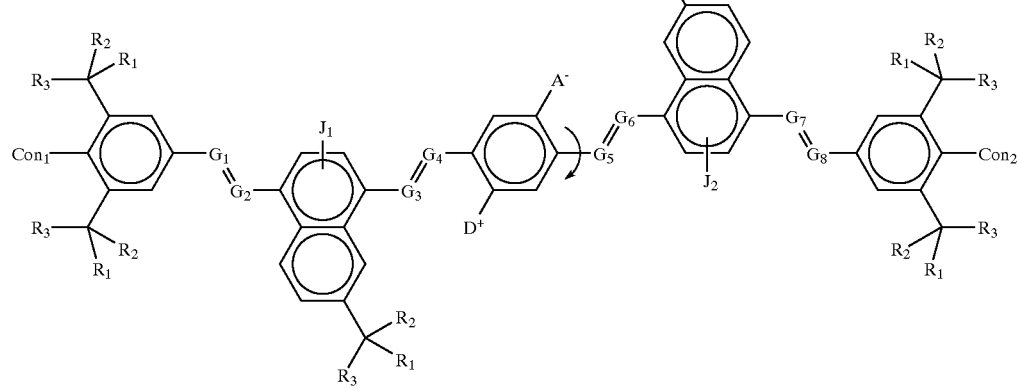

On State (Optical State I)

Switch On || Switch Off

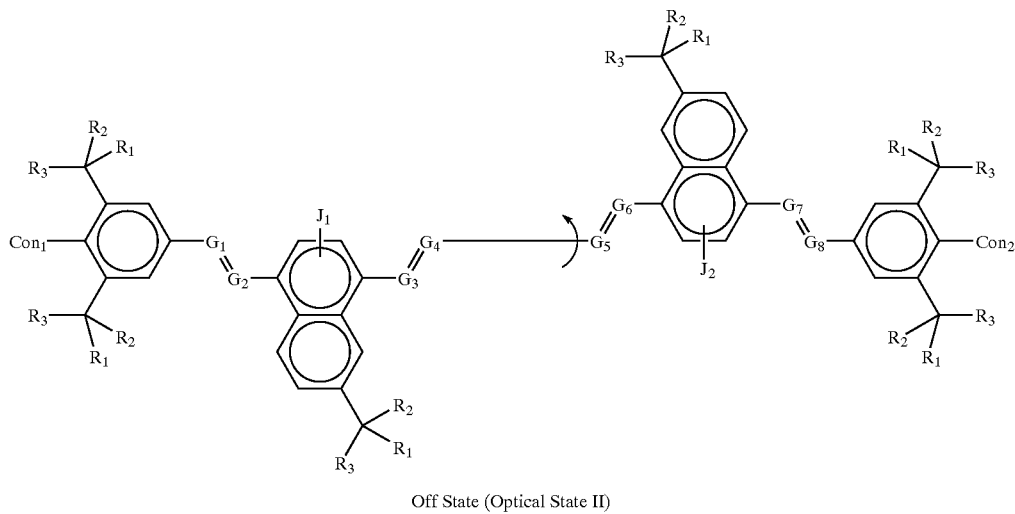

Off State (Optical State II)

where:

A⁻ is said Acceptor group;

D⁺ is said Donor group;

$Con_1$ and $Con_2$ are said connecting units;

$R_1$, $R_2$ and $R_3$ are said spacing groups, which are independently selected from the group consisting of: (a) hydrogen, (b) saturated or unsaturated hydrocarbons, and (c) substituted hydrocarbons;

$G_1$, $G_2$, $G_3$, $G_4$, $G_5$, $G_6$, $G_7$, and $G_8$ are said bridging groups, which are independently selected from the group consisting of: (a) hetero atoms selected from the group consisting of N, O, S, and P, (b) functional groups with at least one of said hetero atoms, (c) saturated or unsaturated hydrocarbons, and (d) substituted hydrocarbons; and $J_1$ and $J_2$ are tuning groups to provide at least one appropriate functional effect selected from the group consisting of inductive effects, resonance effects, and steric effects, said tuning groups being selected from the group consisting of: (a) hydrogen, (b) hetero atoms selected from the group consisting of N, O, S, P, B, F, Cl, Br and I, (c) functional groups with at least one of said hetero atoms, (d) saturated or unsaturated hydrocarbons, and (e) substituted hydrocarbons.

8. The molecular system of claim 1 wherein said electric field induced band gap occurs via a change of extended conjugation via chemical bonding change to change the band gap.

9. The molecular system of claim 8 wherein said electric field induced band gap change occurs via a change of extended conjugation via charge separation or recombination accompanied by increasing or decreasing band localization.

10. The molecular system of claim 9 comprising two portions, wherein a change from a first state to a second state occurs with an applied electric field, said change involving charge separation in changing from said first state to said second state, thereby resulting in a relatively larger band gap state, with less π-delocalization, and recombination of charge in changing from said second state to said first state, thereby resulting in a relatively smaller band gap state, with greater π-delocalization.

11. The molecular system of claim 10 comprising:

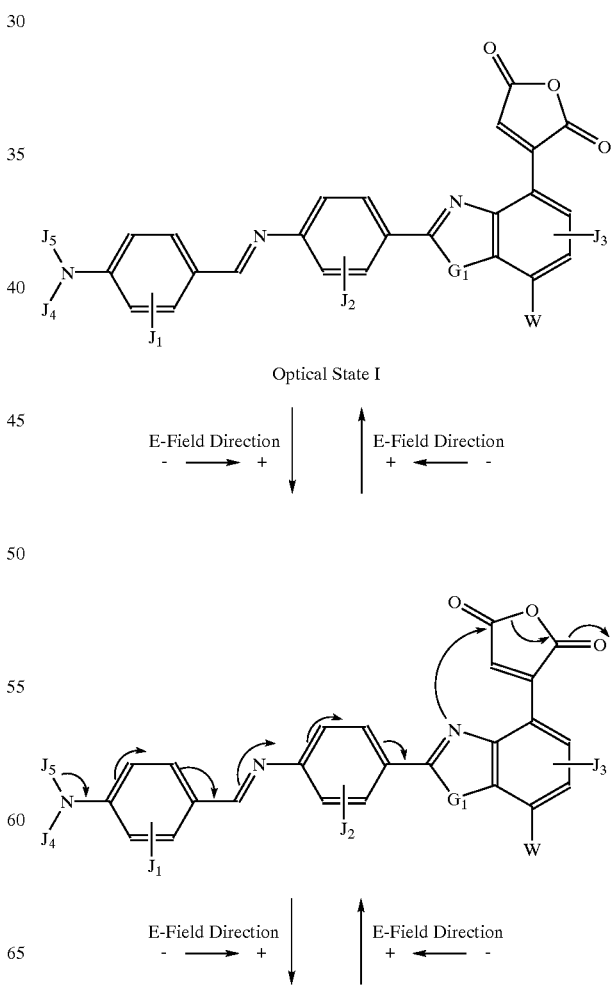

Optical State I

E-Field Direction
−  ⟶  +

E-Field Direction
+  ⟵  −

E-Field Direction
−  ⟶  +

E-Field Direction
+  ⟵  −

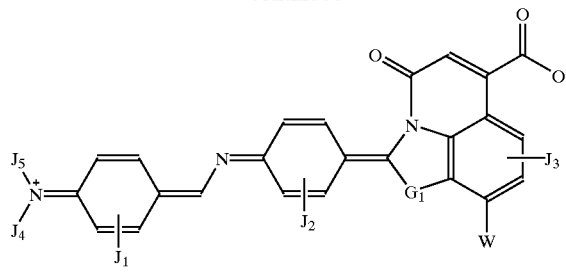

Optical State II where:

$J_1$, $J_2$, $J_3$, $J_4$ and $J_5$ are tuning groups to provide at least one appropriate functional effect selected from the group consisting of inductive effects, resonance effects, and steric effects, said tuning groups being selected from the group consisting of: (a) hydrogen, (b) hetero atoms selected from the group consisting of N, O, S, P, B, F, Cl, Br and I, (c) functional groups with at least one of said hetero atoms, (d) saturated or unsaturated hydrocarbons, and (e) substituted hydrocarbons;

$G_1$ is a bridging group to connect at least two conjugated rings to achieve a desired chromophore, said bridging group selected from the group consisting of: (a) hetero atoms selected from the group consisting of N, O, S, and P, (b) functional groups with at least one of said hetero atoms, (c) saturated or unsaturated hydrocarbons, and (d) substituted hydrocarbons; and W is an electron-withdrawing group for tuning reactivity of the maleic anhydride group of said molecular system, which enables said molecular system to undergo a smooth charge separation or recombination upon application of said electric field, said electron-withdrawing group selected from the group consisting of: (a) carboxylic acid and its derivatives, (b) nitro, (c) nitrile, (d) ketone, (e) aldehyde, (f) sulfone, (g) sulfuric acid and its derivatives, (h) hetero atoms selected from the group consisting of F, Cl, Br, N, O and S, and (i) functional groups with at least one of said hetero atoms.

12. The molecular system of claim 10 comprising:

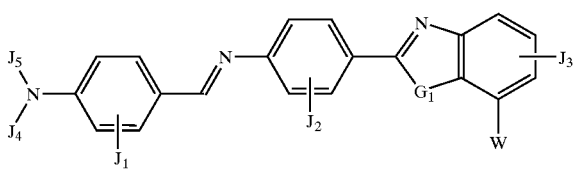

Optical State I
Eg (HOMO/LUMO) = 3.46eV
(When $R_1 = R_2 = R_4 = R_5 = H$; $R_3 = CH_3$)

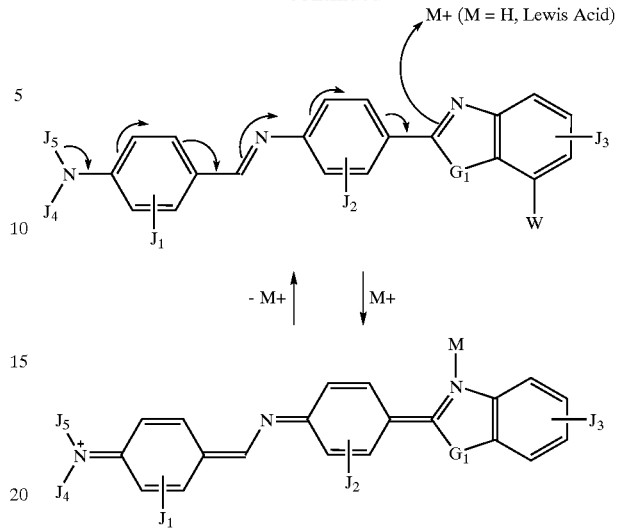

Optical State II
Eg (HOMO/LUMO) = 2.04eV
(When $R_1 = R_2 = R_4 = R_5 = H$; $R_3 = CH_3$)

where:

$J_1$, $J_2$, $J_3$, $J_4$ and $J_5$ are tuning groups to provide at least one appropriate functional effect selected from the group consisting of inductive effects, resonance effects, and steric effects, said tuning groups being selected from the group consisting of: (a) hydrogen, (b) hetero atoms selected from the group consisting of N, O, S, P, B, F, Cl, Br and I, (c) functional groups with at least one of said hetero atoms, (d) saturated or unsaturated hydrocarbons, and (e) substituted hydrocarbons;

$G_1$ is a bridging group to connect at least two conjugated rings to achieve a desired chromophore, said bridging group selected from the group consisting of: (a) hetero atoms selected from the group consisting of N, O, S, and P, (b) functional groups with at least one of said hetero atoms, (c) saturated or unsaturated hydrocarbons, and (d) substituted hydrocarbons; and $M^+$ is selected from the group consisting of transition metals, their halogen complexes, $H^+$, and Lewis acids.

13. The molecular system of claim 8 wherein said electric field induced band gap occurs via a change of extended conjugation via charge separation or recombination and π-bond breaking or formation.

14. The molecular system of claim 13 wherein said molecular system comprises two portions, wherein a change from a first state to a second state occurs with an applied electric field, said change involving charge separation in changing from said first state to said second state, wherein in said first state, there is extended conjugation throughout said molecular system, resulting in a relatively larger band gap state, and wherein in said second state, said extended conjugation is changed and separated positive and negative charges are created within said molecular system, resulting in a relatively smaller band gap state.

15. The molecular system of claim 14 comprising:

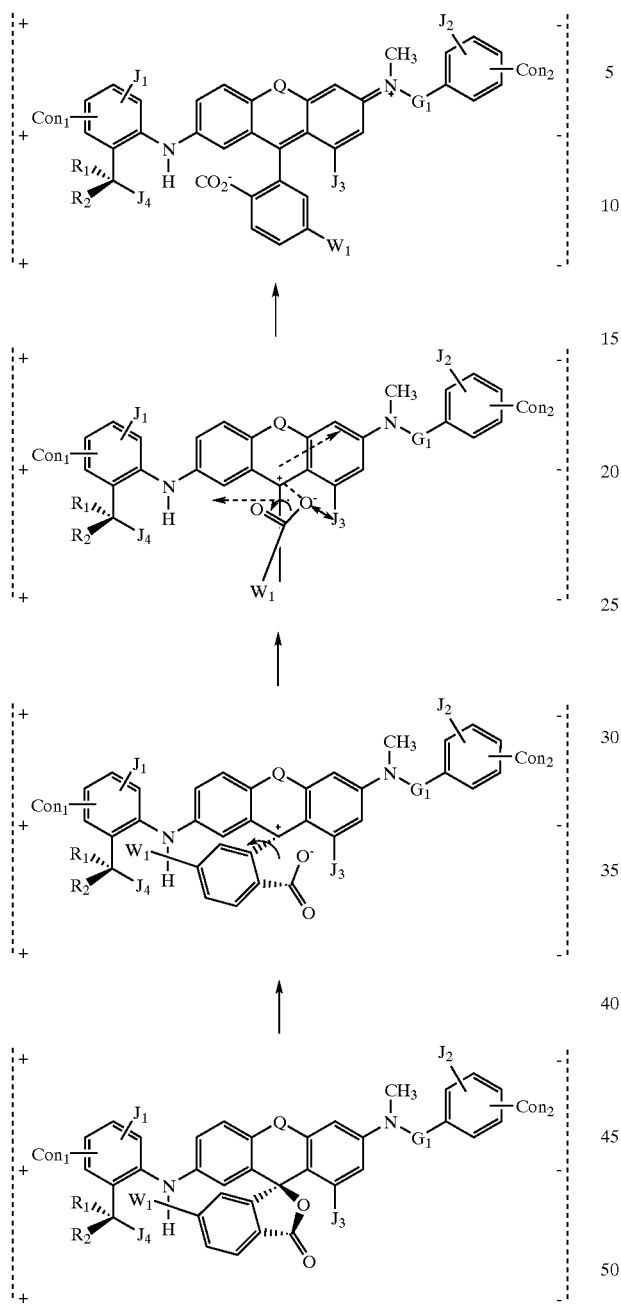

where:
- Q is a connecting unit between two phenyl rings and is selected from the group consisting of: S, O, NH, NR, hydrocarbon, or substituted hydrocarbon;
- $Con_1$ and $Con_2$ are connecting units between one molecule and another molecule or between a molecule and a solid substrate selected from the group consisting of a metal electrode, an inorganic substrate, and an organic substrate, said connecting units independently selected from the group consisting of: (a) hydrogen (utilizing a hydrogen bond), (b) multivalent hetero atoms selected from the group consisting of C, N, O, S, and P, (c) functional groups containing said hetero atoms, (d) saturated or unsaturated hydrocarbons, and (e) substituted hydrocarbons;
- $R_1$ and $R_2$ are spacing groups for providing an appropriate 3-dimensional scaffolding to allow molecules to pack together while providing rotational space for each rotor, said spacing groups selected from the group consisting of: (a) hydrogen, (b) saturated or unsaturated hydrocarbon, and (c) substituted hydrocarbon;
- $J_1$, $J_2$, $J_3$, and $J_4$ are tuning groups to provide at least one appropriate functional effect selected from the group consisting of inductive effects, resonance effects, and steric effects, said tuning groups being selected from the group consisting of: (a) hydrogen, (b) hetero atoms selected from the group consisting of N, O, S, P, B, F, Cl, Br and I, (c) functional groups with at least one of said hetero atoms, (d) saturated or unsaturated hydrocarbons, and (e) substituted hydrocarbons;
- $G_1$ is a bridging group to connect either (a) a stator portion and a rotor portion of said molecular system or (b) at least two conjugated rings to achieve a desired chromophore, said bridging group selected from the group consisting of: (a) hetero atoms selected from the group consisting of N, O, S, and P, (b) functional groups with at least one of said hetero atoms, (c) saturated or unsaturated hydrocarbons, and (d) substituted hydrocarbons; and
- W is an electron-withdrawing group for tuning reactivity of the maleic anhydride group of said molecular system, which enables said molecular system to undergo a smooth charge separation or recombination upon application of said electric field, said electron-withdrawing group selected from the group consisting of: (a) carboxylic acid and its derivatives, (b) nitro, (c) nitrile, (d) ketone, (e) aldehyde, (f) sulfone, (g) sulfuric acid and its derivatives, (h) hetero atoms selected from the group consisting of F, Cl, Br, N, O and S, and (i) functional groups with at least one of said hetero atoms.

16. The molecular system of claim 14 wherein said molecular system comprises:

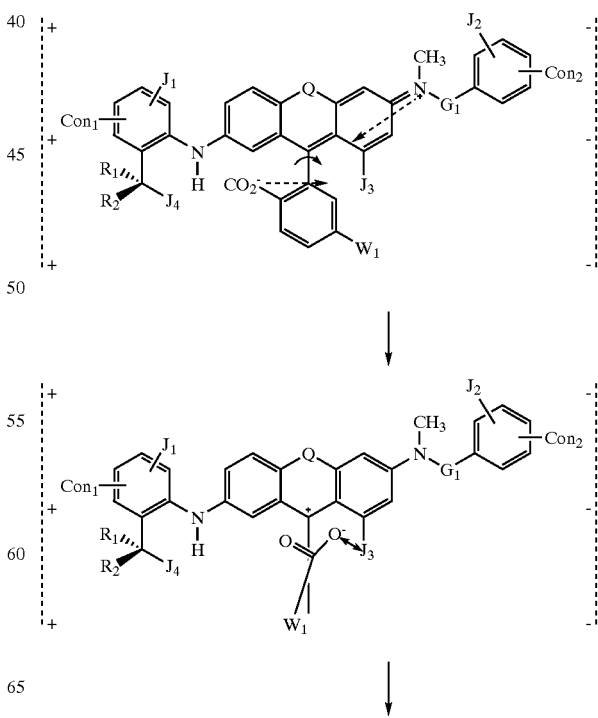

-continued

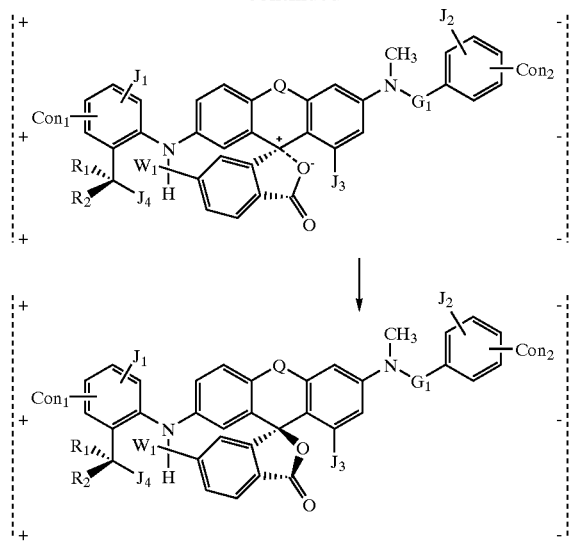

where:
- Q is a connecting unit between two phenyl rings and is selected from the group consisting of: S, O, NH, NR, hydrocarbon, or substituted hydrocarbon;
- $Con_1$ and $Con_2$ are connecting units between one molecule and another molecule or between a molecule and a solid substrate selected from the group consisting of a metal electrode, an inorganic substrate, and an organic substrate, said connecting units independently selected from the group consisting of: (a) hydrogen (utilizing a hydrogen bond), (b) multivalent hetero atoms selected from the group consisting of C, N, O, S, and P, (c) functional groups containing said hetero atoms, (d) saturated or unsaturated hydrocarbons, and (e) substituted hydrocarbons;
- $R_1$ and $R_2$ are spacing groups for providing an appropriate 3-dimensional scaffolding to allow molecules to pack together while providing rotational space for each rotor, said spacing groups selected from the group consisting of: (a) hydrogen, (b) saturated or unsaturated hydrocarbon, and (c) substituted hydrocarbon;
- $J_1$, $J_2$, $J_3$, and $J_4$ are tuning groups to provide at least one appropriate functional effect selected from the group consisting of inductive effects, resonance effects, and steric effects, said tuning groups being selected from the group consisting of: (a) hydrogen, (b) hetero atoms selected from the group consisting of N, O, S, P, B, F, Cl, Br and I, (c) functional groups with at least one of said hetero atoms, (d) saturated or unsaturated hydrocarbons, and (e) substituted hydrocarbons;
- $G_1$ is a bridging group to connect either (a) a stator portion and a rotor portion of said molecular system or (b) at least two conjugated rings to achieve a desired chromophore, said bridging group selected from the group consisting of: (a) hetero atoms selected from the group consisting of N, O, S, and P, (b) functional groups with at least one of said hetero atoms, (c) saturated or unsaturated hydrocarbons, and (d) substituted hydrocarbons; and
- W is an electron-withdrawing group for tuning reactivity of the maleic anhydride group of said molecular system, which enables said molecular system to undergo a smooth charge separation or recombination upon application of said electric field, said electron-withdrawing group selected from the group consisting of: (a) carboxylic acid and its derivatives, (b) nitro, (c) nitrile, (d) ketone, (e) aldehyde, (f) sulfone, (g) sulfuric acid and its derivatives, (h) hetero atoms selected from the group consisting of F, Cl, Br, N, O and S, and (i) functional groups with at least one of said hetero atoms.

17. The molecular system of claim 1 wherein said electric field induced band gap change occurs via molecular folding or stretching.

18. The molecular system of claim 17 wherein said molecular system comprises three portions, a first portion and a third portion, each bonded to a second, central portion, wherein a change from a first state to a second state occurs with an applied electric field, said change involving a folding or stretching about or of said second portion, respectively, wherein in said first state, there is extended conjugation throughout said molecular system, resulting in a relatively smaller band gap state, and wherein in said second state, said extended conjugation is changed, resulting in a relatively larger band gap.

19. The molecular system of claim 18 wherein said molecular system comprises:

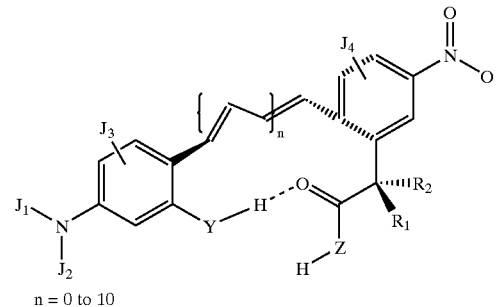

n = 0 to 10

Molecule Folding ∥ Stretching Out

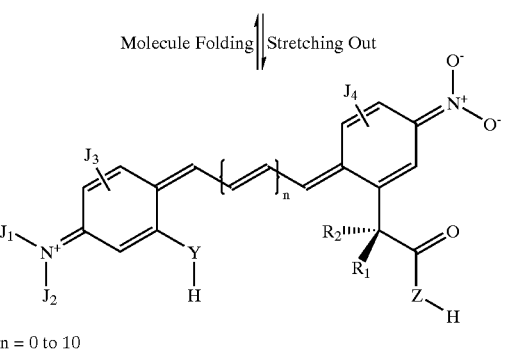

n = 0 to 10 where:
- $R_1$ and $R_2$ are spacing groups selected from the group consisting of: (a) hydrogen, (b) saturated or unsaturated hydrocarbons, and (c) substituted hydrocarbons;
- $J_1$, $J_2$, $J_3$, $J_4$ and $J_5$ are tuning groups to provide at least one appropriate functional effect selected from the group consisting of inductive effects, resonance effects, and steric effects, said tuning groups being selected from the group consisting of: (a) hydrogen, (b) hetero atoms selected from the group consisting of N, O, S, P, B, F, Cl, Br and I, (c) functional groups with at least one of said hetero atoms, (d) saturated or unsaturated hydrocarbons, and (e) substituted hydrocarbons; and
- Y and Z are functional groups that form inter-molecular or intra-molecular hydrogen bonding and are selected from the group consisting of: (a) SH, (b) OH, (c) amine, (d) hydrocarbons, and (e) substituted hydrocarbons.

* * * * *